United States Patent
Saito

(10) Patent No.: US 6,893,740 B2
(45) Date of Patent: May 17, 2005

(54) CPP TYPE MAGNETORESISTIVE SENSOR INCLUDING PINNED MAGNETIC LAYER PROVIDED WITH HARD MAGNETIC REGION

(75) Inventor: Masamichi Saito, Niigata-ken (JP)

(73) Assignee: Alps Electric Co., Ltd., Tokyo (JP)

(*) Notice: Subject to any disclaimer, the term of this patent is extended or adjusted under 35 U.S.C. 154(b) by 0 days.

(21) Appl. No.: 10/422,177

(22) Filed: Apr. 23, 2003

(65) Prior Publication Data

US 2003/0203238 A1 Oct. 30, 2003

(30) Foreign Application Priority Data

Apr. 24, 2002 (JP) .................................... 2002-121896

(51) Int. Cl.[7] .............................................. G11B 5/127
(52) U.S. Cl. ...................... 428/668; 428/675; 428/678; 428/686; 428/692; 360/324.11
(58) Field of Search ................................. 428/668, 675, 428/678, 686, 692; 360/324.11

(56) References Cited

U.S. PATENT DOCUMENTS

| | | | |
|---|---|---|---|
| 5,668,688 A | | 9/1997 | Dykes et al. |
| 5,910,344 A | * | 6/1999 | Hasegawa et al. .......... 427/599 |
| 6,023,395 A | | 2/2000 | Dill et al. |
| 6,064,552 A | | 5/2000 | Iwasaki et al. |
| 6,313,973 B1 | * | 11/2001 | Fuke et al. ............... 360/324.1 |
| 6,436,526 B1 | | 8/2002 | Odagawa et al. |
| 2002/0159201 A1 | | 10/2002 | Li et al. |
| 2003/0043503 A1 | * | 3/2003 | Grigoryevich et al. ...... 360/110 |

FOREIGN PATENT DOCUMENTS

| | | |
|---|---|---|
| JP | 8-279115 | 10/1996 |
| JP | 8-279116 | 10/1996 |
| JP | 9-107136 | 4/1997 |

* cited by examiner

Primary Examiner—Kevin M. Bernatz
(74) Attorney, Agent, or Firm—Brinks Hofer Gilson & Lione

(57) ABSTRACT

A magnetoresistive sensor and a method of manufacturing the magnetoresistive sensor are provided, which can effectively increase ΔRA, and which can more easily and reliably bring magnetization of a free magnetic layer and magnetization of a pinned magnetic layer into an orthogonal state than the related art. By forming the pinned magnetic layer of a multilayered structure comprising a first hard magnetic layer, a nonmagnetic layer, and a second hard magnetic layer, the magnetization of the free magnetic layer and the magnetization of the pinned magnetic layer can be more easily and reliably brought into an orthogonal state than in the related art. Also, the pinned magnetic layer can be formed in a larger film thickness than that in the related art. Accordingly, the product (ΔRA) of a resistance change amount (ΔR) and a sensor area (A) in a direction parallel to film surfaces can be increased.

18 Claims, 12 Drawing Sheets

US 6,893,740 B2

CPP TYPE MAGNETORESISTIVE SENSOR INCLUDING PINNED MAGNETIC LAYER PROVIDED WITH HARD MAGNETIC REGION

This application claims the benefit of priority to Japanese Patent Application 2002-121896, filed on Apr. 24, 2002.

BACKGROUND OF THE INVENTION

1. Field of the Invention

The present invention relates to a CPP type magnetoresistive sensor in which a current flows in a direction perpendicular to film surfaces of layers of a multilayered film. More particularly, the present invention relates to a magnetoresistive sensor and a method of manufacturing the magnetoresistive sensor, which can effectively increase the product ($\Delta$RA) of a resistance change amount ($\Delta$R) and a sensor area (A), and which can more easily and reliably bring magnetization of a free magnetic layer and magnetization of a pinned magnetic layer into an orthogonal state than the related art.

2. Description of the Related Art

FIG. 13 is a sectional view of a structure of a conventional magnetoresistive sensor, as viewed from the side of a sensor surface positioned to face a recording medium.

The magnetoresistive sensor shown in FIG. 13 is of CPP (Current Perpendicular to the Plane) type in which a current is supplied in a direction perpendicular to film surfaces of a multilayered film.

Reference numeral 1 in FIG. 13 denotes a lower electrode layer. A multilayered film 6 is formed on the lower electrode layer 1, the multilayered film 6 comprising a free magnetic layer 2, a nonmagnetic material layer 3, a pinned magnetic layer 4, and an antiferromagnetic layer 5 which are successively formed in this order from the lowermost side. A track width Tw is defined by a width size of the multilayered film 6 in the direction of the track width (X-direction as shown). The free magnetic layer 2 and the pinned magnetic layer 4 are each formed of, e.g., a NiFe alloy. The nonmagnetic material layer 3 is formed of, e.g., Cu, and the antiferromagnetic layer 5 is formed of, e.g., PtMn.

On each of both sides of the multilayered film 6 in the direction of the track width, a first insulating layer 7, a hard bias layer 8, and a second insulating layer 9 are successively formed on the lower electrode layer 1 in this order from the lowermost side. The first insulating layer 7 and the second insulating layer 9 are each formed of an insulating material such as $Al_2O_3$. The hard bias layer 8 is formed of, e.g., CoPt.

Further, as shown in FIG. 13, an upper electrode layer 10 is formed so as to cover an upper surface of the multilayered film 6 and upper surfaces of both the second insulating layers 9.

In the magnetoresistive sensor shown in FIG. 13, with heat treatment performed on the sensor under a magnetic field, an exchange coupling magnetic field is generated between the antiferromagnetic layer 5 and the pinned magnetic layer 4, and hence the pinned magnetic layer 4 is fixedly magnetized in the height direction (Y-direction as shown). Also, since the hard bias layers 8 formed on both sides of the free magnetic layer 2 in the direction of the track width (X-direction as shown) are magnetized in the direction of the track width, magnetization of the free magnetic layer 2 is put in order in the X-direction as shown with a longitudinal bias magnetic field applied from the hard bias layers 8.

Thus, the fixed magnetization of the pinned magnetic layer 4 and the magnetization of the free magnetic layer 2 are in a state orthogonal to each other. Then, when a current is supplied from the electrode layers 1, 10 to flow through the multilayered film 6 in the direction of film thickness and a magnetic field leaked from the recording medium is applied in the Y-direction, the magnetization of the free magnetic layer 2 is changed from the X-direction toward Y-direction. Depending on the relationship between a variation in the direction of magnetization of the free magnetic layer 2 and the fixed direction of magnetization of the pinned magnetic layer 4, electrical resistance is changed (this is called the magnetoresistive effect). As a result, the magnetic field leaked from the recording medium is detected in accordance with a voltage change caused upon the change in value of the electrical resistance.

As described above, the magnetoresistive sensor shown in FIG. 13 is of CPP type in which a current flows through the multilayered film 6 in the direction perpendicular to the film surfaces. Because the CPP type magnetoresistive sensor can produce a larger reproduction output with a reduction of the device size than that produced by a CIP (Current in the Plane) type magnetoresistive sensor in which a current flows through the multilayered film 6 in a direction parallel to the film surfaces, the CPP type sensor is expected to be properly adaptable for the reduction of the device size, which will be necessitated with a tendency toward a higher recording density in future.

One problem to be overcome for realizing practical use of the CPP type magnetoresistive sensor adapted for a tendency toward a higher recording density is to increase the product ($\Delta$RA) of a resistance change amount ($\Delta$R) and a sensor area (A) in the direction parallel to the film surfaces. With an increase of $\Delta$RA, the reproduction output can be increased more effectively.

In the case of the CPP type magnetoresistive sensor, $\Delta$RA can be increased by increasing a film thickness t1 of the pinned magnetic layer 4. Although $\Delta$RA can be increased by increasing the film thickness t1 of the pinned magnetic layer 4, the exchange coupling magnetic field generated between the antiferromagnetic layer 5 and the pinned magnetic layer 4 is reduced as the film thickness t1 of the pinned magnetic layer 4 increases. Such a reduction of the exchange coupling magnetic field causes the magnetization of the pinned magnetic layer 4, which should be firmly pinned in the height direction, to easily fluctuate with the external magnetic field, etc. Hence, the orthogonal relation in the direction of magnetization between the free magnetic layer 2 and the pinned magnetic layer 4 is lost, thus resulting in a deterioration of characteristics such as lowering of a resistance change rate ($\Delta$MR) and occurrence of Barkhauzen noise.

For that reason, it has hitherto been difficult to effectively achieve an increase of $\Delta$RA and reliable adjustment in fixing the magnetization of the pinned magnetic layer 4.

FIG. 14 shows a magnetoresistive sensor, which is also of CPP type similar to the magnetoresistive sensor shown in FIG. 13, but differs from it in a manner of controlling the magnetization of the free magnetic layer 2. In the magnetoresistive sensor shown in FIG. 13 the hard bias layers 8 are formed on both sides of the free magnetic layer 2 in the direction of the track width, and the magnetization of the free magnetic layer 2 is oriented in the direction of the track width with the longitudinal bias magnetic field applied from the hard bias layers 8.

On the other hand, in the magnetoresistive sensor shown in FIG. 14, second antiferromagnetic layers 11 are formed on the free magnetic layer 2 with a spacing corresponding to the track width Tw left therebetween in the direction of the track width (X-direction as shown). The magnetization in opposite end portions of the free magnetic layer 2 is pinned in the direction of the track width by the exchange coupling magnetic field generated between the free magnetic layer 2 and the second antiferromagnetic layers 11, whereas the magnetization in a central area of the free magnetic layer 2 is weakly put into a single domain state to such an extent that the magnetization is reversible with the external magnetic field.

Then, as shown in FIG. 14, insulating layers 12 made of, e.g., $Al_2O_3$ are formed on the second antiferromagnetic layers 11, and an upper electrode layer 10 is formed so as to cover the free magnetic layer 2 and both the insulating layers 12.

In the magnetoresistive sensor shown in FIG. 14, as in the magnetoresistive sensor shown in FIG. 13, it is also been difficult to effectively achieve an increase of ΔRA and reliable adjustment in fixing the magnetization of the pinned magnetic layer 4.

Further, in the magnetoresistive sensor shown in FIG. 14, because it must be subjected to heat treatment under a magnetic field to generate the exchange coupling magnetic field between the free magnetic layer 2 and the second antiferromagnetic layers 11, the heat treatment under the magnetic field must be performed twice, including the heat treatment under the magnetic field to generate the exchange coupling magnetic field between the pinned magnetic layer 4 and the antiferromagnetic layer 5.

However, various restrictions are imposed on conditions, such as the intensity of the magnetic field and the temperature of the heat treatment, when the second heat treatment under the magnetic field is performed to generate the exchange coupling magnetic field between the free magnetic layer 2 and the second antiferromagnetic layers 11 after performing the first heat treatment under the magnetic field to generate the exchange coupling magnetic field between the pinned magnetic layer 4 and the antiferromagnetic layer 5.

The reason is as follows. When performing the second heat treatment under the magnetic field, if the intensity of the magnetic field, for example, is greater than the exchange coupling magnetic field generated between the pinned magnetic layer 4 and the antiferromagnetic layer 5, the magnetization of the pinned magnetic layer 4, which should be pinned in the height direction, is caused to fluctuate under an effect of the second heat treatment under the magnetic field. Such a fluctuation can be avoided by reducing the intensity of the magnetic field applied in the second heat treatment under the magnetic field. However, if the intensity of the magnetic field is too much reduced, the exchange coupling magnetic field cannot be generated at an appropriate level of intensity between the free magnetic layer 2 and the second antiferromagnetic layers 11, and the magnetization in the opposite end portions of the free magnetic layer 2 cannot be properly pinned. Consequently, a magnetoresistive sensor satisfactorily adaptable for a tendency toward a narrower track cannot be manufactured.

Thus, the presence of the above-described restrictions makes it difficult to manufacture the magnetoresistive sensor, and there has been a fear of reduction in yield of manufacturing of the magnetoresistive sensor because the orthogonal relation between the free magnetic layer 2 and the pinned magnetic layer 4 is lost depending on the conditions in the heat treatment under the magnetic field.

SUMMARY OF THE INVENTION

Accordingly, it is an object of the present invention to overcome the above-mentioned problems in the related art, and more particularly to provide a magnetoresistive sensor and a method of manufacturing the magnetoresistive sensor, which can effectively increase ΔRA, and which can more easily and reliably bring magnetization of a free magnetic layer and magnetization of a pinned magnetic layer into an orthogonal state than the related art.

To achieve the above object, the present invention provides a magnetoresistive sensor including a multilayered film comprising a free magnetic layer and a pinned magnetic layer formed adjacent to the free magnetic layer with a nonmagnetic material layer interposed therebetween, the sensor being supplied with a current flowing in a direction perpendicular to film surfaces of the layers of the multilayered film, wherein a hard magnetic region formed of a hard magnetic material is present in the pinned magnetic layer, the pinned magnetic layer is fixedly magnetized in a direction parallel to a height direction, and magnetization of the free magnetic layer is oriented in a direction parallel to a direction of a track width.

Thus, according to the present invention, the pinned magnetic layer includes a hard magnetic region therein. The hard magnetic region has a strong coercive force Hc. To develop and pin magnetization of the hard magnetic region in the height direction, it is just required to apply a magnetic field to magnetize the pinned magnetic region in the height direction without utilizing an exchange coupling magnetic field generated between an antiferromagnetic layer and a pinned magnetic layer, which has been necessitated in the related art. Therefore, the magnetizations of the free magnetic layer and the pinned magnetic layer can be more easily and reliably brought into an orthogonal state than in the related art.

Also, according to the present invention, since the pinned magnetic layer can be fixedly magnetized without utilizing the exchange coupling magnetic field generated using an antiferromagnetic layer, the pinned magnetic layer can be formed in a larger film thickness than that in the related art. Hence, the product (ΔRA) of a resistance change amount (ΔR) and a sensor area (A) in a direction parallel to film surfaces can be increased.

ΔRA does not depend on the film thickness only. ΔRA is expressed by a formula (1), i.e., $\Delta RA \propto [\beta^2/(1-\beta^2)] \cdot \rho \cdot t$. In this formula, β is a value determined depending on material properties of the film itself, and satisfies a formula (2) of $\rho\downarrow/\rho\uparrow = (1+\beta)/(1-\beta)$ [where $\rho\downarrow$ represents a specific resistance value with respect to down-spin ones of conductive electrons, and $\rho\uparrow$ represents a specific resistance value with respect to up-spin ones of conductive electrons]. Also, ρ is specific resistance value (average one of specific resistance values with respect to both the down-spin conductive electrons and the up-spin conductive electrons) of the pinned magnetic layer. Further, t is a film thickness.

As seen from the formula (1), ΔRA increases with an increase of the β value and an increase of the specific resistance value ρ.

In other words, to effectively increase ΔRA, it is important to select a hard magnetic material having a higher β value and a higher specific resistance value ρ in addition to increasing of the film thickness.

The reason (mechanism) why the resistance change amount (ΔR) is increased with an increase of the β value is as follows. With an increase of the β value, as seen from the above formula (2), the specific resistance value (ρ↓) with respect to the down-spin conductive electrons is increased, and the specific resistance value (ρ↑) with respect to the up-spin conductive electrons is decreased. This can be interpreted as implying that the down-spin conductive electrons become harder to flow in the hard magnetic layer or are shut out and the mean free path of the down-spin conductive electrons is shortened (which results in an insulating behavior), while the up-spin conductive electrons become easier to flow in the hard magnetic layer and the mean free path of the up-spin conductive electrons is lengthened (which results in a metallic behavior), whereby the difference in mean free path between the up-spin conductive electrons and the down-spin conductive electrons is increased (which results in an increase of bulk scattering).

In the present invention, therefore, the hard magnetic material used as the pinned magnetic layer preferably has a stronger coercive force Hc, a higher β value and a higher specific resistance value ρ.

In the present invention, preferably, the hard magnetic region is formed of a CoPt alloy, a CoPtX alloy (where X represents one or more noble metal elements selected from among Ru, Re, Pd, Os, Ir, Pt, Au and Rh), or a CoPtY alloy (where Y represents one or more elements selected from among Sc, Ti, V, Cr, Mn, Fe, Co, Ni and Cu).

Each of those hard magnetic materials has a coercive force Hc of not less than about $15.8 \times 10^3$ (A/m) [=200 Oe], a β value of not smaller than 0.3 in absolute value, and a specific resistance value ρ of not smaller than 20 ($\mu\Omega$·cm).

In the present invention, preferably, a Pt amount of the CoPt alloy, the CoPtX alloy or the CoPtY alloy is not less than 12 at %, but not more than 34 at %. These conditions enable the hard magnetic materials to have a specific resistance value ρ of not smaller than 30 ($\mu\Omega$·cm) and a coercive force Hc of not less than about $15.8 \times 10^3$ (A/m) [=200 Oe].

Further, in the present invention, the Pt amount is more preferably not less than 15 at %, but not more than 30 at %, even more preferably not less than 17 at %, but not more than 29 at %, and most preferably not less than 18 at %, but not more than 26 at %. In each of these composition ratio ranges, the Pt amount is even preferably not less than 26 at %.

In the present invention, preferably, the hard magnetic region is formed in a film thickness of not less than 30 Å, but not more than 200 Å. In the related art, unless the pinned magnetic layer is formed in a film thickness of less than 30 Å, it has been impossible to generate a large exchange coupling magnetic field between the pinned magnetic layer and the antiferromagnetic layer, and to properly pin the magnetization of the pinned magnetic layer. According to the present invention, with the provision of the pinned magnetic layer including the hard magnetic region having a strong coercive force Hc, the film thickness of the pinned magnetic layer can be increased. As a result, ΔRA can be increased in accordance with the above-mentioned formula (1) and hence a higher reproduction output can be achieved.

In the present invention, preferably, the pinned magnetic layer is of a multilayered structure formed by sandwiching a nonmagnetic layer between one hard magnetic layer and an other hard magnetic layer. Magnetizations of the two hard magnetic layers are brought into an antiparallel state with the nonmagnetic layer interposed therebetween. By forming each of the two hard magnetic layers using a hard magnetic material having a strong coercive force Hc, an overall coercive force Hc of the pinned magnetic layer as a whole can be increased, whereby the magnetization of the pinned magnetic layer can be more firmly pinned in a direction parallel to the height direction.

In the present invention, preferably, the pinned magnetic layer may be of a multilayered structure formed by sandwiching a nonmagnetic layer between a hard magnetic layer and a first ferromagnetic layer, and an first antiferromagnetic layer may be formed on one surface of the first ferromagnetic layer opposed to an other surface thereof in contact with the nonmagnetic layer.

In such a modification, when magnetization of the first ferromagnetic layer is pinned in one direction parallel to the height direction by an exchange coupling magnetic field generated between the first ferromagnetic layer and the first antiferromagnetic layer, the hard magnetic layer is magnetized in a state antiparallel to the magnetization of the first ferromagnetic layer by RKKY exchange coupling developed therebetween through the nonmagnetic layer. The magnetization of the hard magnetic layer is hence properly pinned by both its own coercive force Hc and the exchange coupling based on the RKKY interaction.

In the present invention, preferably, in the first ferromagnetic layer, a region containing an element Z (where Z represents at least one element selected from among Cr, Ti, V, Zr, Nb, Mo, Hf, Ta and W) is present in a portion locating from an interface with the first antiferromagnetic layer toward the nonmagnetic layer, and a region not containing the element Z is present in a part of a region locating from an interface with the nonmagnetic layer toward the first antiferromagnetic layer. This feature contributes to effectively enhancing the exchange coupling magnetic field generated between the first ferromagnetic layer and the first antiferromagnetic layer, and at the same time to effectively enhancing the exchange coupling generated between the hard magnetic layer and the first ferromagnetic layer based on the RKKY interaction through the nonmagnetic layer interposed therebetween. Hence, the magnetization of the pinned magnetic layer can be more positively pinned.

In the present invention, preferably, the first ferromagnetic layer is formed of primarily a CoFe alloy, the region containing the element Z is formed of a CoFeZ alloy, and the region not containing the element Z is formed of a CoFe alloy.

In the present invention, preferably, a second ferromagnetic layer is interposed between the hard magnetic layer and the nonmagnetic layer. This feature contributes to more effectively enhancing the exchange coupling generated based on the RKKY interaction through the nonmagnetic layer. Further, in the present invention, a third ferromagnetic layer is preferably formed on one surface of the hard magnetic layer opposed to an other surface thereof in contact with the nonmagnetic layer. Moreover, in the present invention, preferably, the second ferromagnetic layer and/or the third ferromagnetic layer is preferably formed of a CoFe alloy.

In the present invention, preferably, a support ferromagnetic layer and a second antiferromagnetic layer are successively formed on one surface of the free magnetic layer opposed to an other surface thereof in contact with the nonmagnetic material layer, and a direction of magnetization of the support ferromagnetic layer is oriented in a direction crossing a direction of magnetization of the pinned magnetic layer by an exchange coupling magnetic field generated between the second antiferromagnetic layer and the support ferromagnetic layer.

In the present invention, preferably, the free magnetic layer is brought into a single domain state by interlayer coupling magnetic field generated between the free magnetic layer and the support ferromagnetic layer through the nonmagnetic layer, and a direction of magnetization of the free magnetic layer is oriented in a direction crossing a direction of magnetization of the pinned magnetic layer.

In the present invention, preferably, the nonmagnetic layer is formed of one or an alloy of two or more selected from among Ru, Rh, Ir, Cr, Re and Cu.

In the present invention, preferably, the pinned magnetic layer is formed below the free magnetic layer, and at least a partial region of the pinned magnetic layer is formed to extend beyond a track width in the direction of the track width. This feature contributes to weakening the effect of demagnetizing fields generated from opposite end portions of the pinned magnetic layer upon the free magnetic layer.

In the present invention, preferably, the nonmagnetic layer is formed of one or an alloy of two or more selected from among Ru, Rh, Ir, Cr, Re and Cu.

In the present invention, preferably, the hard magnetic region is formed of a CoPt alloy, a CoPtX alloy (where X represents one or more noble metal elements selected from among Ru, Re, Pd, Os, Ir, Pt, Au and Rh), or a CoPtY alloy (where Y represents one or more elements selected from among Sc, Ti, V, Cr, Mn, Fe, Co, Ni and Cu). Each of those hard magnetic materials has a strong coercive force Hc, a high β value, and a high specific resistance value ρ. It is hence possible to reliably pin the magnetization of the pinned magnetic layer, and to satisfactorily increase ΔRA.

In the present invention, preferably, a Pt amount of the CoPt alloy, the CoPtX alloy or the CoPtY alloy is not less than 12 at %, but not more than 34 at %. Also, in the present invention, the Pt amount is more preferably not less than 15 at %, but not more than 30 at %, even more preferably not less than 17 at %, but not more than 29 at %, and most preferably not less than 18 at %, but not more than 26 at %. In each of these composition ratio ranges, the Pt amount is even preferably not less than 26 at %.

In the present invention, preferably, the hard magnetic region is formed in a film thickness of not less than 30 Å, but not more than 200 Å. The film thickness of the hard magnetic layer can be increased, and therefore ΔRA can be satisfactorily increased.

DESCRIPTION OF THE PREFERRED EMBODIMENTS

Figure 1:
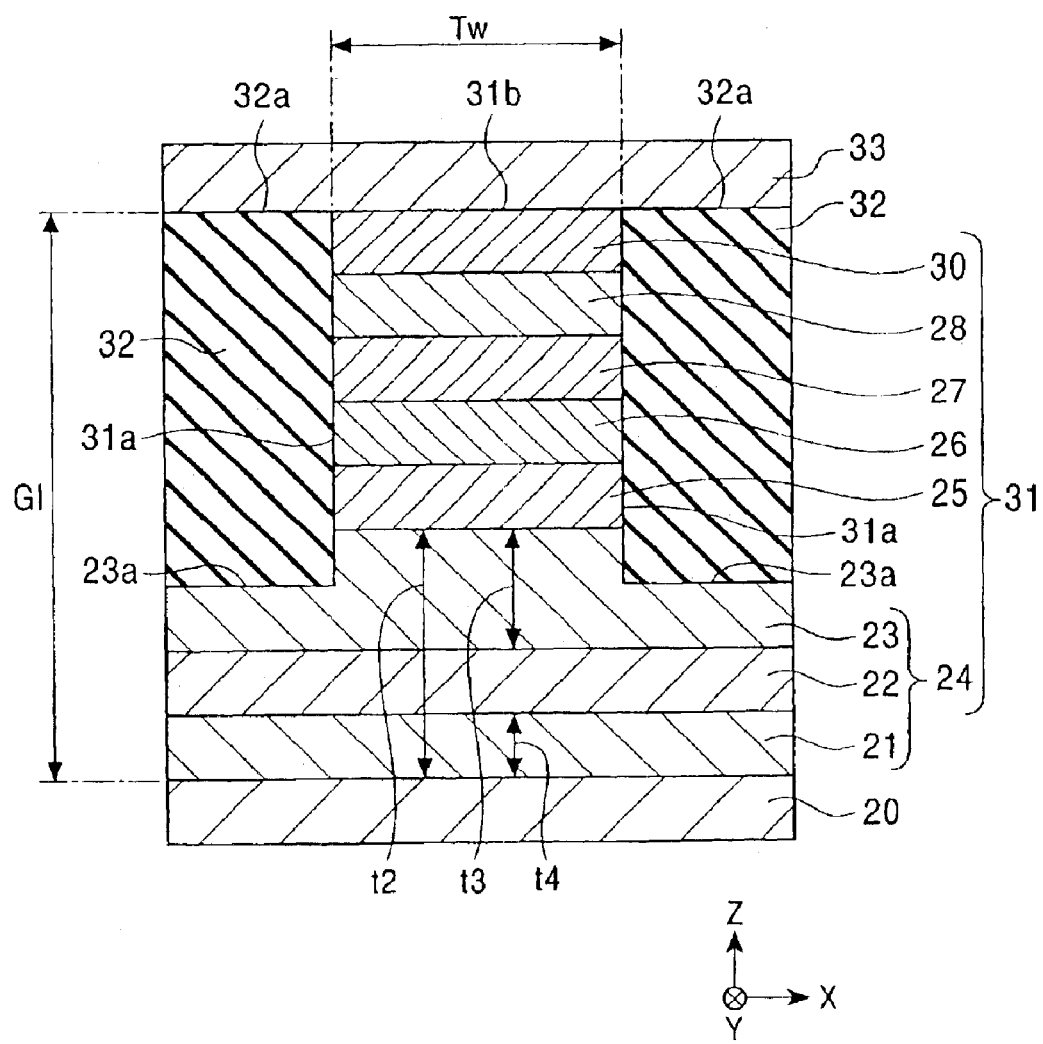
FIG. 1 is a sectional view of a magnetoresistive sensor according to a first embodiment of the present invention.

FIG. 1 is a partial sectional view, as viewed from the side of a sensor surface positioned to face a recording medium, of a magnetoresistive sensor according to a first embodiment of the present invention.

A magnetoresistive sensor shown in FIG. 1 is a GMR head for reproducing an external signal recorded on a recording medium. Though not shown, an inductive head for recording may be formed so as to overlie the magnetoresistive sensor. Note that, in FIG. 1, the sensor surface positioned to face the recording medium is a plane parallel to the X-Z plane. Also, when the magnetoresistive sensor is used in a floating magnetic head, the sensor surface positioned to face the recording medium means the so-called ABS (Air Bearing Surface).

The magnetoresistive sensor is formed on a trailing end surface of a slider made of, e.g., alumina-titanium-carbide ($Al_2O_3$—TiC). The slider is joined to an elastically deformable support member made of a stainless material, for example, on the side of a surface opposed to the sensor surface positioned to face the recording medium, whereby a magnetic head device is constituted.

The term "direction of the track width" means the direction of width of an area in which the direction of magnetization varies with an external magnetic field. By way of example, the direction of the track width is the direction of magnetization resulting when no external magnetic field is applied to the free magnetic layer, i.e., the X-direction as shown.

Furthermore, a recording medium is positioned opposite to a surface of the magnetoresistive sensor positioned to face the recording medium, and is in the Z-direction as shown. The direction of a magnetic field leaked from the recording medium is the Y-direction as shown.

Reference numeral 20 shown in FIG. 1 denotes a lower shielding layer formed of a magnetic material such as a NiFe alloy. In this embodiment, the lower shielding layer 20 serves also as a lower electrode.

A first hard magnetic layer 21 formed of a hard magnetic material is formed on the lower shielding layer 20, a nonmagnetic layer 22 is formed on the first hard magnetic layer 21, and a second hard magnetic layer 23 is formed on the nonmagnetic layer 22. In this embodiment, those three layers, i.e., the first hard magnetic layer 21, the nonmagnetic layer 22, and the second hard magnetic layer 23, constitute a pinned magnetic layer 24.

As shown in FIG. 1, a nonmagnetic material layer 25 is formed on the pinned magnetic layer 24. The nonmagnetic material layer 25 is formed of an electrically conductive material having a low electrical resistance, such as Cu.

Then, a free magnetic layer 26 is formed on the nonmagnetic material layer 25. A nonmagnetic layer 27 is formed on the free magnetic layer 26, and a support ferromagnetic layer 28 is formed on the nonmagnetic layer 27. Further, an antiferromagnetic layer (referred to also as a second antiferromagnetic layer in the following description) 30 is formed on the support ferromagnetic layer 28.

In the embodiment shown in FIG. 1, a laminate from the pinned magnetic layer 24 to the antiferromagnetic layer 30 is referred to as a multilayered film 31. As shown in FIG. 1, the multilayered film 31 has opposite end surfaces 31a, 31a spaced in the direction of the track width (X-direction as shown), which are formed by etching opposite end portions of the multilayered film 31 from a top surface toward a bottom surface. The etched surfaces are formed until reaching an intermediate depth point of the second hard magnetic layer 23. A track width Tw is defined by a width size of the free magnetic layer 26 between the opposite end surfaces 31a and 31a spaced in the direction of the track width.

Also, in the embodiment shown in FIG. 1, opposite end portions of the films positioned from midway the second hard magnetic layer 23 to the first hard magnetic layer 21 on the lower side are not subjected to the above-mentioned etching, and those films have a greater width size in the direction of the track width than the track width Tw.

In the embodiment shown in FIG. 1, insulating layers 32 are formed so as to cover upper surfaces 23a of the second hard magnetic layer 23, which are extended outward from an area corresponding to the track width Tw, and the opposite end surfaces 31a of the multilayered film 31. The insulating layers 32 are each formed of a known insulating material such as $Al_2O_3$ and $SiO_2$.

In the embodiment shown in FIG. 1, an upper shielding layer 33 made of a magnetic material, such as a NiFe alloy, is formed to cover a top surface 31b of the multilayered film 31 and upper surfaces 32a of the insulating layers 32. The upper shielding layer 33 serves also as an upper electrode of the magnetoresistive sensor.

In the embodiment shown in FIG. 1, because the lower shielding layer 20 and the upper shielding layer 33 each function not only as a shielding, but also as an electrode, a gap length G1 is decided based on the film thickness from the first hard magnetic layer 21 to the antiferromagnetic layer 30, and hence a value of the gap length G1 can be reduced.

In the embodiment shown in FIG. 1, the shielding layers 20, 33 serving also as electrodes are formed respectively on the lower and upper sides of the multilayered film 31 made up of from the first hard magnetic layer 21 to the antiferromagnetic layer 30, thereby constituting a CPP (Current Perpendicular to the Plane) type structure in which a current flows between the shielding layer 20 and 33 in the direction of thickness of the multilayered film 31 (Z-direction as shown).

In the magnetoresistive sensor of this embodiment, when the magnetic field leaked from the recording medium is applied in the Y-direction, the magnetization of the free magnetic layer 26 is changed from a direction parallel to the X-direction toward the Y-direction. Depending on the relationship between a variation in the direction of magnetization of the free magnetic layer 26 and the fixed direction of magnetization of the second hard magnetic layer 23 in the pinned magnetic layer 24, electrical resistance is changed (this is called the magnetoresistive effect). As a result, the magnetic field leaked from the recording medium is detected in accordance with a voltage change caused upon the change in value of the electrical resistance.

Features of the magnetoresistive sensor shown in FIG. 1 will be described below.

In the embodiment shown in FIG. 1, the pinned magnetic layer 24 is formed in a three-layered structure comprising the first hard magnetic layer 21, the second hard magnetic layer 23, and the nonmagnetic layer 22 interposed between these two layers.

Figure 13:
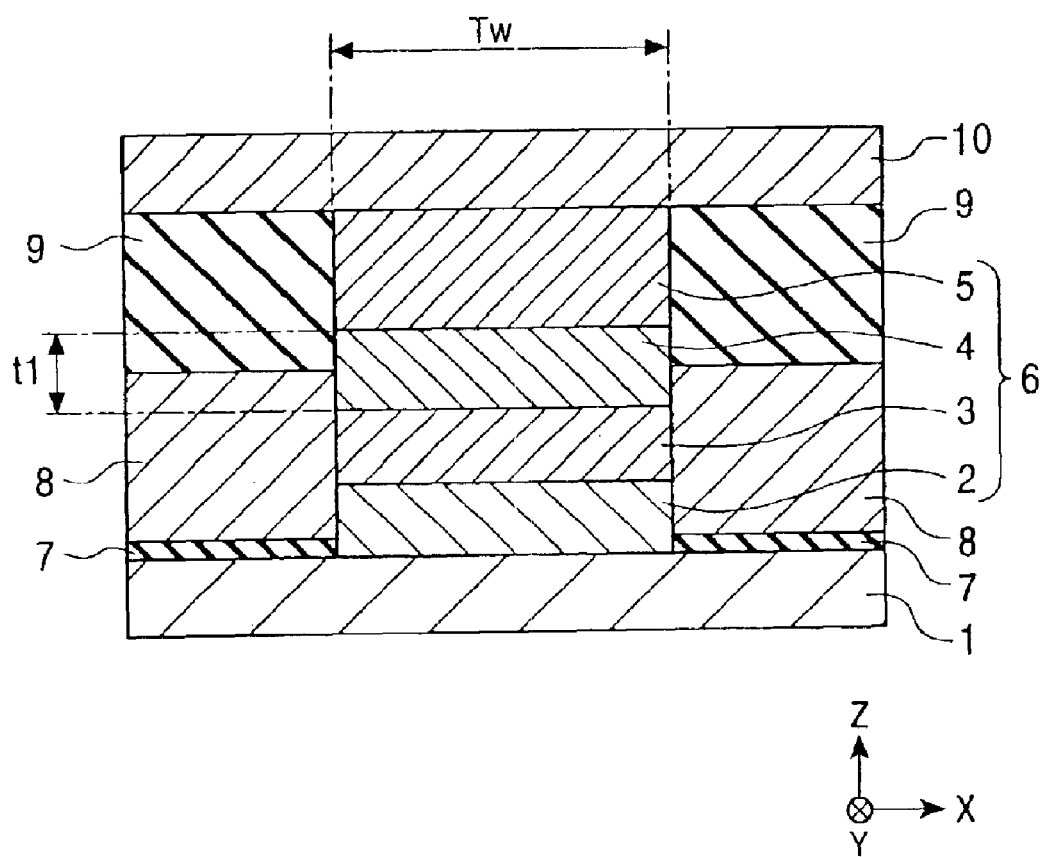
FIG. 13 is a sectional view of one conventional magnetoresistive sensor.

In the related art, the pinned magnetic layer (4 in FIGS. 13 and 14) is formed as a ferromagnetic layer of, e.g., a NiFe alloy or a CoFe alloy. Then, an antiferromagnetic layer is formed in contact with an interface of the pinned magnetic layer in the direction of film thickness (Z-direction as shown) to generate an exchange coupling magnetic field between the pinned magnetic layer and the antiferromagnetic layer by performing heat treatment under a magnetic field, whereupon the magnetization of the pinned magnetic layer is pinned in the height direction (Y-direction as shown).

By contrast, in the embodiment of FIG. 1, the above antiferromagnetic layer in the related art is not employed and the hard magnetic layers 21, 23 are used to constitute the pinned magnetic layer 24. The magnetization of the pinned magnetic layer 24 is pinned by utilizing strong coercive forces Hc of the hard magnetic layers 21, 23.

More specifically, in the embodiment shown in FIG. 1, each of the first hard magnetic layer 21 and the second hard magnetic layer 23 constituting the pinned magnetic layer 24 has a stronger coercive force Hc than that of a NiFe alloy, a CoFe alloy, etc. When a magnetic field is applied to the pinned magnetic layer 24 in the height direction (Y-direction as shown), by way of example, without heat treatment, the second hard magnetic layer 23 is magnetized in the same direction as that of the applied magnetic field, i.e., the height direction, and the magnetization of the second hard magnetic layer 23 is pinned in the height direction by its own coercive force Hc. On the other hand, the magnetization of the first hard magnetic layer 21 is reversed by exchange coupling with respect to the second hard magnetic layer 23 based on the RKKY interaction through the nonmagnetic layer 22. Thus, the magnetization of the first hard magnetic layer 21 is oriented in a direction opposed to the height direction (i.e., direction opposed to the Y-direction as shown) in which the second hard magnetic layer 23 is magnetized, and then pinned in the direction opposed to the height direction by its own coercive force Hc and the exchange coupling based on the RKKY interaction.

By providing hard magnetic regions, which are formed as the hard magnetic layers, in the pinned magnetic layer 24 as in the embodiment shown in FIG. 1, the following advantages are expected.

First, the pinned magnetic layer 24 can be formed in a larger film thickness t2. The first hard magnetic layer 21 and the second hard magnetic layer 23 constituting the pinned magnetic layer 24 have a film thickness t4 and t3, respectively. When the magnetization of the pinned magnetic layer (4 in FIGS. 13 and 14) is pinned by the exchange coupling magnetic field generated between the pinned magnetic layer and the antiferromagnetic layer like the related art, there has been a problem that the exchange coupling magnetic field is reduced as the film thickness of the pinned magnetic layer increases. On the other hand, when the magnetization of the pinned magnetic layer 24 is pinned by utilizing the strong coercive forces Hc of the first hard magnetic layer 21 and the second hard magnetic layer 23 themselves like the embodiment shown in FIG. 1, the pinned magnetization can be maintained by the strong coercive forces Hc even with an increase of the film thicknesses t3, t4 of the hard magnetic layers 21, 23, and the hard magnetic layers 21, 23 can be formed in larger film thicknesses t3, t4. In the CPP type magnetoresistive sensor shown in FIG. 1, therefore, it is possible to increase the film thickness t2 of the pinned magnetic layer 24 and hence to increase the product (ΔRA) of a resistance change amount (ΔR) and a sensor area (A) in the direction parallel to the film surfaces.

In the embodiment shown in FIG. 1, the second hard magnetic layer 23 is a layer actually contributing to the magnetoresistive effect. Accordingly, by setting the film thickness t3 of the second hard magnetic layer 23 to be larger than the film thickness t4 of the first hard magnetic layer 21, a greater effect of bulk scattering is expected and a further increase of ΔRA can be achieved. With the increase of ΔRA, a higher reproduction output can be obtained.

A second advantage resulting from the feature that the magnetization of the pinned magnetic layer 24 is pinned by utilizing the strong coercive forces Hc of the first hard magnetic layer 21 and the second hard magnetic layer 23 themselves without utilizing the exchange coupling magnetic field generated at the interface between the pinned magnetic layer 24 and the antiferromagnetic layer, as shown in FIG. 1, resides in point of enabling the magnetization of the pinned magnetic layer 24 and the magnetization of the free magnetic layer 26 to easily and reliably cross each other in an orthogonal state.

Figure 14:
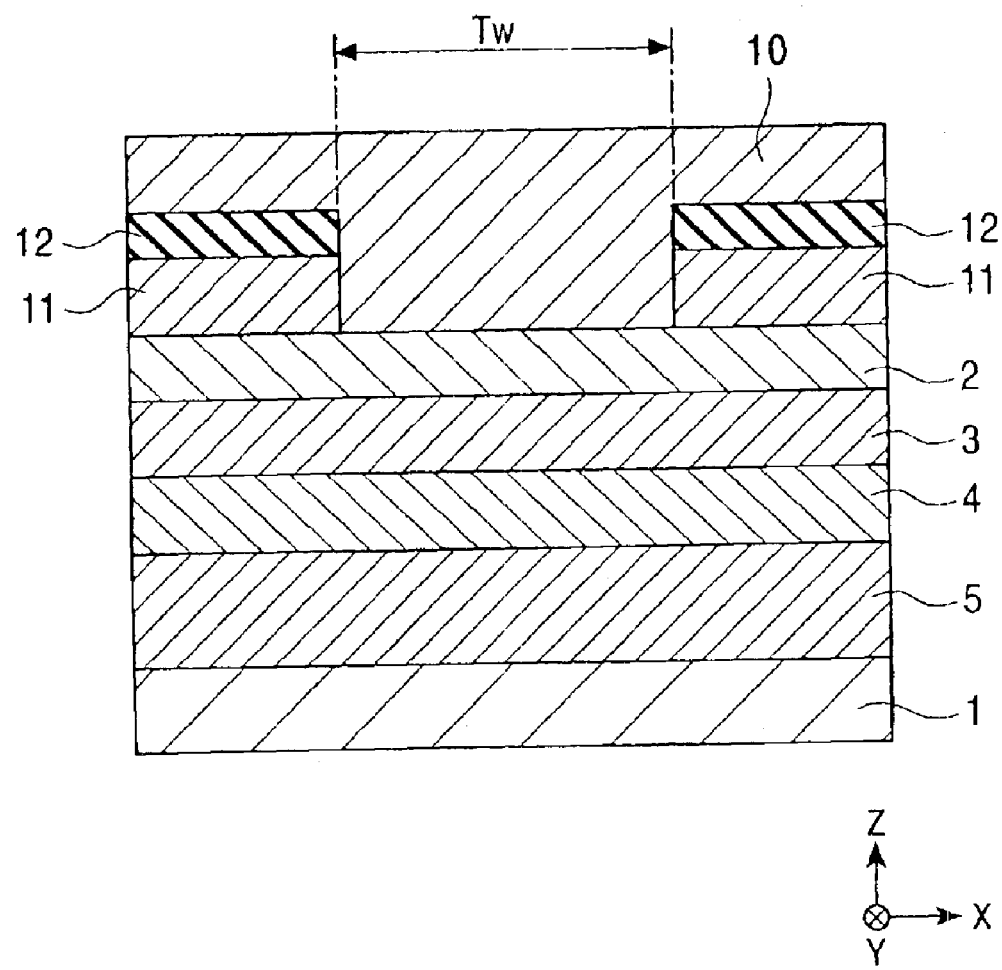
FIG. 14 is a sectional view of another conventional magnetoresistive sensor.

When employing the antiferromagnetic layers 5, 11 to pin the magnetization of the pinned magnetic layer 4 and the magnetization in the opposite end portions of the free magnetic layer 2 like the related art shown in FIG. 14, the heat treatment under the magnetic field must be performed twice. In such a case, there are several restrictions regarding conditions, such as the intensity of the magnetic field and the temperature of the heat treatment. Unless the proper heat treatment under the magnetic field is performed within those restrictions, a satisfactory orthogonal relation cannot be achieved between the magnetization of the pinned magnetic layer 4 and the magnetization of the free magnetic layer 2.

On the other hand, in the embodiment shown in FIG. 1, the magnetization of the pinned magnetic layer 24 is pinned without utilizing the exchange coupling magnetic field generated at the interface between the pinned magnetic layer and the antiferromagnetic layer, and the pinned magnetic layer 24 is made up of the first hard magnetic layer 21 and the second hard magnetic layer 23 each having a strong coercive force Hc. Therefore, magnetization control of the hard magnetic layers 21, 23 can be performed by applying a magnetic field without heat treatment. Under the effect of the magnetic field applied for the magnetization control of the hard magnetic layers 21, 23, the magnetizations of the free magnetic layer 26 and the support ferromagnetic layer 28 are temporarily oriented in the same direction as that of the applied magnetic field. However, because, as described later, interlayer coupling acts between the free magnetic layer 26 and the support ferromagnetic layer 28 and an exchange coupling magnetic field acts between the support ferromagnetic layer 28 and the antiferromagnetic layer 30, the magnetizations of the free magnetic layer 26 and the support ferromagnetic layer 28 are returned again to the direction of the track width (X-direction as shown) upon release of the applied magnetic field. Consequently, the magnetization of the free magnetic layer 26 and the magnetization of the pinned magnetic layer 24 are properly held in an orthogonal state.

In the embodiment shown in FIG. 1, there are no restrictions imposed on the intensity of the magnetic field to be applied for pinning the magnetizations of the hard magnetic layers 21, 23. For example, the applied magnetic field may be set greater than the interlayer coupling acting between the free magnetic layer 26 and the support ferromagnetic layer 28 and the exchange coupling magnetic field generated between the support ferromagnetic layer 28 and the antiferromagnetic layer 30. The reason resides in that no heat treatment is performed when applying the magnetic field to pin the magnetizations of the hard magnetic layers 21, 23. Because of no heat treatment being performed, the magnetizations of the support ferromagnetic layer 28 and the free magnetic layer 26 are returned again to a direction parallel to the direction of the track width (X-direction as shown) upon release of the applied magnetic field under the actions of the exchange coupling magnetic field and the interlayer coupling mentioned above, whereby the magnetization of the pinned magnetic layer 24 and the magnetization of the free magnetic layer 26 can be held in a satisfactory orthogonal state.

Thus, in the embodiment shown in FIG. 1, since delicate restrictions, which have been required in the related art, are no longer required for achieving the orthogonal state of the magnetizations of the pinned magnetic layer 24 and the free magnetic layer 26, the magnetizations of the pinned magnetic layer 24 and the free magnetic layer 26 can be easily and reliably made cross each other in an orthogonal state.

As characteristics required for the first hard magnetic layer 21 and the second hard magnetic layer 23, each of the first hard magnetic layer 21 and the second hard magnetic layer 23 must have a strong coercive force Hc. This is because the magnetizations of the first hard magnetic layer 21 and the second hard magnetic layer 23 cannot be effectively pinned in a direction parallel to the height direction unless each layer has the strong coercive force Hc. The strong coercive force Hc of each of the first hard magnetic layer 21 and the second hard magnetic layer 23 is preferably not less than about $15.8 \times 10^3$ (A/m) [=200 Oe].

A description is now made of characteristics required for the first hard magnetic layer 21 and the second hard magnetic layer 23 from the viewpoint of, in particular, increasing ΔRA.

To increase ΔRA, each of the first hard magnetic layer 21 and the second hard magnetic layer 23 preferably has a higher β value and a higher specific resistance value ρ. ΔRA is expressed by the following formula (1):

$$\Delta RA \propto \alpha [\beta^2/(1-\beta^2)] \cdot \rho \cdot t$$

As seen from the formula (1), for the purpose of increasing ΔRA, it is preferable that the β value be higher, the specific resistance value ρ be higher, and the film thickness t be larger. As described above, because the hard magnetic layers 21, 23 each have the strong coercive force Hc, the hard magnetic layers 21, 23 can be formed in larger film thicknesses t3, t4 and the film thicknesses t3, t4 of the hard magnetic layers 21, 23 can be increased to increase ΔRA. However, those film thicknesses are preferably smaller than the spin diffusion distance of a conductive spin within the ferromagnetic layer. Here, the term "spin diffusion distance" represents how far a conductive spin diffuses (moves) while holding an up-spin or a down-spin. If those film thicknesses are larger than the spin diffusion distance, this increases the probability that an up-spin electron having entered the ferromagnetic layer is changed to a down-spin electron somewhere within the ferromagnetic layer. On the other hand, the magnetoresistive effect can be enhanced with an increase of the mean free path of an up-spin and a decrease of the mean free path of a down-spin. When the up-spin is changed to the down-spin, the mean free path of the up-spin is interrupted at that point. For that reason, those film thicknesses are preferably set smaller than the spin diffusion distance.

Next, the β value is a value specific to the material properties of the hard magnetic layers 21, 23 and satisfies a formula (2), i.e., $\rho\downarrow/\rho\uparrow=(1+\beta)/(1-\beta)$ [where $\rho\downarrow$ represents a specific resistance value with respect to down-spin ones of conductive electrons, and $\rho\uparrow$ represents a specific resistance value with respect to up-spin ones of conductive electrons].

The reason (mechanism) why the resistance change amount (ΔR) is increased with an increase of the β value is as follows. With an increase of the β value, as seen from the above formula (2), the specific resistance value ($\rho\downarrow$) with respect to the down-spin conductive electrons is increased, and the specific resistance value ($\rho\uparrow$) with respect to the up-spin conductive electrons is decreased. This can be interpreted as implying that the down-spin conductive electrons become harder to flow in the hard magnetic layer or are shut out and the mean free path of the down-spin conductive electrons is shortened (which results in an insulating behavior), while the up-spin conductive electrons become easier to flow in the hard magnetic layer and the mean free path of the up-spin conductive electrons is lengthened (which results in a metallic behavior), whereby the difference in mean free path between the up-spin conductive electrons and the down-spin conductive electrons is increased (which results in an increase of bulk scattering).

Each of the first hard magnetic layer 21 and the second hard magnetic layer 23 preferably has the β value of 0.3 or more in absolute value. Note that the β value is defined to be within the range of larger than −1, but smaller than 1. Accordingly, a preferable β value is not smaller than 0.3, but smaller than 1 in absolute value.

Next, the specific resistance value ρ represents a mean value of specific resistance values with respect to the down-spin and up-spin conductive electrons. The specific resistance value ρ of each of the hard magnetic layers 21, 23 is preferably not smaller than 30 ($\mu\Omega\cdot cm$).

Further, a saturation magnetization Ms of each of the hard magnetic layers 21, 23 is preferably not larger than 1.4 T. The saturation magnetization Ms preferably has a smaller value for the reason that, because this condition is effective to reduce a demagnetizing field which is in proportion to Ms×t (magnetic moment per unit area, t=film thickness) and affects the direction of magnetization of the free magnetic layer 26, the film thicknesses t3, t4 of the hard magnetic layers 21, 23 can be increased and hence ΔRA can be increased.

A description is now made of a hard magnetic material having the above-mentioned properties, i.e., a strong coercive force Hc, a high β value, and a high specific resistance value ρ.

The first hard magnetic layer 21 and the second hard magnetic layer 23 are each preferably formed of a CoPt alloy, a CoPtX alloy (where X represents one or more noble metal elements selected from among Ru, Re, Pd. Os, Ir, Pt, Au and Rh), or a CoPtY alloy (where Y represents one or more elements selected from among Sc, Ti, V, Cr, Mn, Fe, Co, Ni and Cu).

The above-mentioned materials are all hard magnetic materials and are each able to have a coercive force Hc of not less than $15.8\times10^3$ (A/m) [=200 Oe]. Also, those materials can be set to a β value of not smaller than 0.3 in absolute value and a specific resistance value ρ of not smaller than 30 ($\mu\Omega\cdot cm$).

Incidentally, the CoPtX alloy is an alloy obtained by adding a noble metal element X to CoPt, and the CoPtY alloy is an alloy obtained by adding a 3d-block transition element Y to CoPt.

According to experiment results described later, the Pt amount of the CoPt alloy, the CoPtX alloy or the CoPtY alloy is preferably not less than 12 at %, but not more than 34 at %. This range of Pt amount ensures that the coercive force Hc can be set not less than $15.8\times10^3$ (A/m) [=200 Oe] and the specific resistance value ρ can be set not smaller than 30 ($\mu\Omega\cdot cm$). Also, the saturation magnetization Ms can be set not more than 1.4 T. The crystal structure of the CoPt alloy, etc. is in a mixed state of a crystal phase close to pure Co and a crystal phase close to pure Pt. Many of Co and Pt are not brought into a solid solution state.

The Pt amount is more preferably not less than 15 at %, but not more than 30 at %, even more preferably not less than 17 at %, but not more than 29 at %, and most preferably not less than 18 at %, but not more than 26 at %. According to experiment results described later, it is possible to further increase the coercive force Hc, further increase the specific resistance value, and further reduce the saturation magnetization by narrowing the Pt composition ratio toward the above-mentioned optimum range.

In particular, by setting the Pt amount to be not less than 18 at %, but not more than 26 at %, the coercive force Hc can be increased to $63.2\times10^3$ (A/m) [=800 oe] or more and the specific resistance value ρ can be increased to the range of 37 to 42 ($\mu\Omega\cdot cm$). Also, the saturation magnetization Ms can be reduced down to 1.2 T or less.

In each of the composition ratio ranges mentioned above, the Pt amount is more preferably not less than 26 at %. By setting the Pt amount to be not less than 26 at %, the coercive force Hc can take a high value in the range of $15.8\times10^3$ [=200 Oe] to $63.2\times10^3$ (A/m) [=800 Oe], and the magnetizations of the first hard magnetic layer 21 and the second hard magnetic layer 23 can be pinned with stability. Also, a specific resistance value of not smaller than about 42 ($\mu\Omega\cdot cm$) can be obtained and therefore ΔR can be increased. Further, since the saturation magnetization Ms can be held down to about 1.2 T or less, the film thicknesses of the first hard magnetic layer 21 and the second hard magnetic layer 23 can be increased and hence ΔR can be increased while weakening the effect of demagnetizing fields upon the free magnetic layer 26.

Additionally, in the embodiment shown in FIG. 1, because of a structure in which the first hard magnetic layer 21 and the second hard magnetic layer 23 are stacked with the nonmagnetic layer 22 interposed therebetween, the overall coercive force Hc of the pinned magnetic layer 24 can be increased in comparison with the case of constituting the pinned magnetic layer 24 as a single hard magnetic layer, for example. As a result, the magnetization of the pinned magnetic layer 24 can be more effectively pinned.

Figure 8:
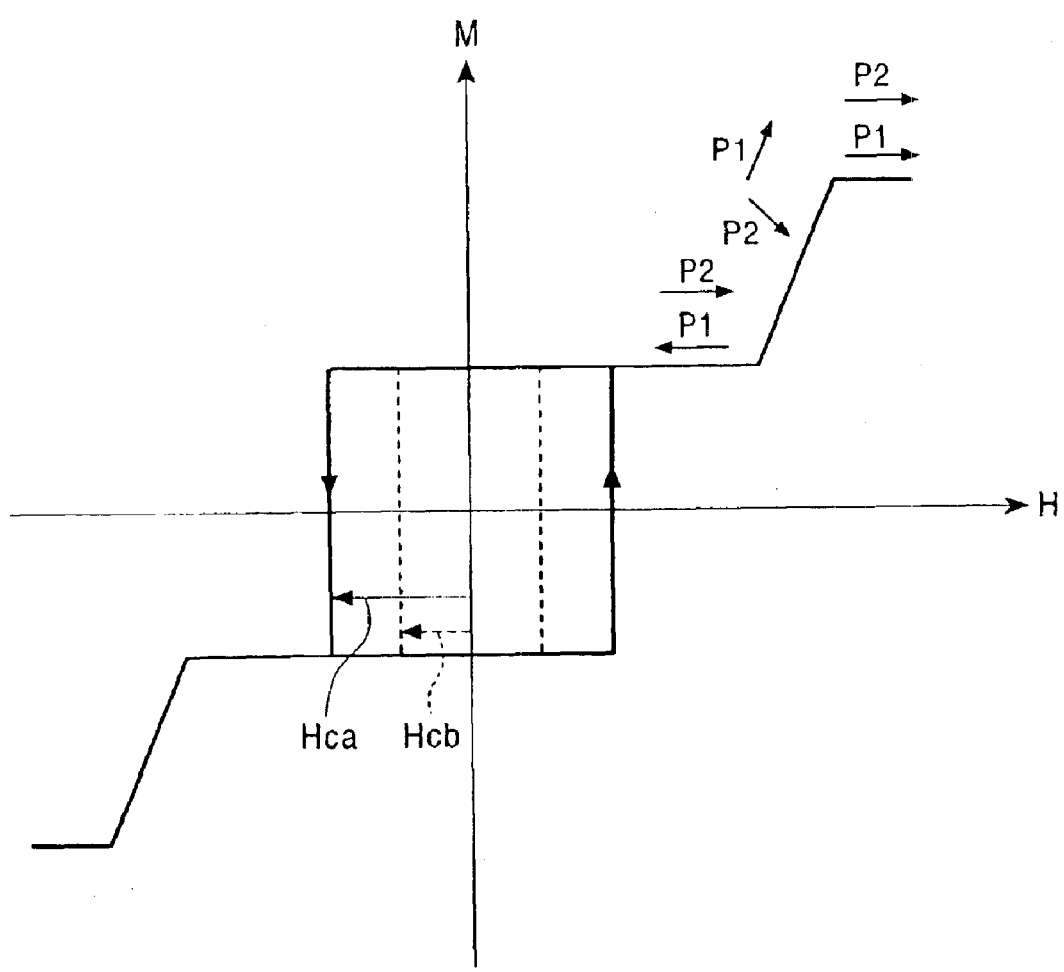
FIG. 8 is a conceptual view of a hysteresis loop of a pinned magnetic layer in the present invention.

FIG. 8 is a conceptual view of a hysteresis loop resulting when the pinned magnetic layer 24 is made up of the two hard magnetic layers 21, 23 with the nonmagnetic layer 22 interposed therebetween, as shown in FIG. 1. It is assumed, for example, that the magnetic moment (saturation magnetization Ms×film thickness t) per unit area of the first hard magnetic layer 21 (direction of magnetization thereof is denoted by P1 in FIG. 8) is smaller than the magnetic moment per unit area of the second hard magnetic layer 23 (direction of magnetization thereof is denoted by P2 in FIG. 8). It is also assumed that the external magnetic field is applied to the right as viewed in FIG. 8.

When the magnitude of the magnetic field applied for control in pinning the magnetization of the pinned magnetic layer 24 exceeds the coercive force Hc, the magnetizations of the first and second hard magnetic layers 21, 23 are brought into an antiparallel state. When the magnitude of the magnetic field applied to the right as viewed in FIG. 8 is increased, the resultant magnetic moment per unit area of the pinned magnetic layer 24 is also increased at a certain gradient. With a further increase in the magnitude of the magnetic field applied to the right as viewed in FIG. 8, the magnetizations of the first hard magnetic layer 21 and the second hard magnetic layer 23 are brought into a perfectly parallel state in which they are both oriented to the right as viewed in FIG. 8 and the resultant magnetic moment per unit area has a constant value.

The coercive force Hc of the pinned magnetic layer 24 made up of the two hard magnetic layers 21, 23 with the nonmagnetic layer 22 interposed therebetween is given by a coercive Hca shown in FIG. 8. When the pinned magnetic layer 24 is constituted, for example, as a single hard magnetic layer, the coercive force Hc of the pinned magnetic layer 24 is given by a coercive force Hcb in FIG. 8, which is smaller than the coercive force Hca obtained with the pinned magnetic layer 24 made up of the two hard magnetic layers 21, 23 with the nonmagnetic layer 22 interposed therebetween.

Thus, to increase the coercive force Hc of the pinned magnetic layer 24, the pinned magnetic layer 24 is preferably of a multilayered structure made up of the two hard magnetic layers 21, 23 with the nonmagnetic layer 22 interposed therebetween. With such a multilayered structure, the pinned magnetization of the pinned magnetic layer 24 becomes harder to reverse under the effect of the external magnetic field, and reproduction characteristics can be effectively improved.

A description is now made of the film thicknesses t3, t4 of the first hard magnetic layer 21 and the second hard magnetic layer 23. In this embodiment, the film thicknesses t3, t4 of the first hard magnetic layer 21 and the second hard magnetic layer 23 are each preferably not less than 30 Å, but not more than 200 Å. The reason why the film thicknesses t3, t4 are each set not less than 30 Å resides in that, when forming the pinned magnetic layer using a ferromagnetic material such as a NiFe alloy in the past, the pinned magnetic layer has been formed in a film thickness of not more than 30 Å.

Also, the film thickness t2 of the pinned magnetic layer 24 is preferably not less than 70 Å, but not more than 400 Å.

Further, the product of the coercive force Hc and the film thickness t for each of the first hard magnetic layer 21 and the second hard magnetic layer 23 is required to be different between the two layers. For example, when both the first hard magnetic layer 21 and the second hard magnetic layer 23 are made of the same material and have the same coercive force Hc, the two layers are preferably formed in different film thicknesses t3, t4 from each other. If the first hard magnetic layer 21 and the second hard magnetic layer 23 are formed to have the same coercive force Hc and the film thicknesses t3, t4 equal to each other, the magnetizations of the first hard magnetic layer 21 and the second hard magnetic layer 23 cannot be brought into a satisfactory antiparallel state when a magnetic field is applied to bring the magnetizations of the first hard magnetic layer 21 and the second hard magnetic layer 23 into an antiparallel state.

In addition, as described above, the film thickness t3 of the second hard magnetic layer 23 is preferably set larger than the film thickness t4 of the first hard magnetic layer 21 for the purpose of effectively causing bulk scattering. However, if the difference in film thickness between those two layers is too large, this would be not preferable.

The reason resides in that a larger difference in film thickness increases the demagnetizing fields generated from the opposite end portions of the pinned hard magnetic layer 24 in the direction of the track width (X-direction as shown).

In the multilayered structure made up of the two hard magnetic layers 21, 23 with the nonmagnetic layer 22 interposed therebetween as shown in FIG. 1, however, the demagnetizing fields can be effectively weakened by properly adjusting the film thicknesses of the hard magnetic layers 21, 23 in comparison with the case of forming the pinned magnetic layer 24 of only one hard magnetic layer. This is because, when the hard magnetic layers 21, 23 are formed of the same material in different film thicknesses t3, t4 from each other, for example, the demagnetizing fields are generated just in amount corresponding to the difference in film thickness. It is therefore important to properly adjust the difference in film thickness for the purpose of weakening the demagnetizing fields. In the embodiment shown in FIG. 1, the difference between the film thickness t4 of the first hard magnetic layer 21 and the film thickness t3 of the second hard magnetic layer 23 is preferably not less than 10 Å, but not more than 100 Å.

While the nonmagnetic layer 22 is interposed between the first hard magnetic layer 21 and the second hard magnetic layer 23, the nonmagnetic layer 22 is preferably formed of one or an alloy of two or more selected from among Ru, Rh, Ir, Cr, Re and Cu. By forming the nonmagnetic layer 22 of a predetermined element, such as Ru, it is possible to develop exchange coupling between the first hard magnetic layer 21 and the second hard magnetic layer 23 based on the RKKY interaction, and to properly bring the magnetizations of the first hard magnetic layer 21 and the second hard magnetic layer 23 into an antiparallel state.

Also, the nonmagnetic layer 22 is preferably formed in a film thickness of not less than 3 Å, but not more than 15 Å. By properly adjusting the film thickness of the nonmagnetic layer 22 within the above-mentioned range, it is possible to enhance the exchange coupling between the first hard magnetic layer 21 and the second hard magnetic layer 23 based on the RKKY interaction, and to properly bring the magnetizations of the first hard magnetic layer 21 and the second hard magnetic layer 23 into an antiparallel state.

The magnitude of the exchange coupling based on the RKKY interaction must be greater than the coercive force Hc of each of the first hard magnetic layer 21 and the second hard magnetic layer 23. The reason resides in that, if the coercive force Hc of at least one of the first hard magnetic layer 21 and the second hard magnetic layer 23 is greater than the exchange coupling based on the RKKY interaction, the magnetizations of the first hard magnetic layer 21 and the second hard magnetic layer 23 could not be properly brought into an antiparallel state in a direction parallel to the height direction (Y-direction as shown), and a deterioration of reproduction characteristics would result in. For example, by forming the nonmagnetic layer 22 of Ru and setting the film thickness of the nonmagnetic layer 22 to be not less than 8 Å, but not more than 11 Å, the magnitude of the exchange coupling based on the RKKY interaction can be increased up to about $39.5 \times 10^3$ (A/m).

In the embodiment shown in FIG. 1, the pinned magnetic layer 24 is formed on the side lower than the free magnetic layer 26 as viewed in the drawing, and opposite end portions of the second hard magnetic layer 23, which constitutes the pinned magnetic layer 24, spaced in the direction of the track width (X-direction as shown) are etched away until reaching an intermediate depth point of the second hard magnetic layer 23, as indicated by the opposite end surfaces 31a, so that the width size of the pinned magnetic layer 24, left on the lower side than the etched portions, in the direction of the track width (X-direction) is extended to be greater than the track width Tw. This structure contributes to further weakening the effect, upon the free magnetic layer 26, of the demagnetizing fields generated in the opposite end portions of the pinned hard magnetic layer 24 spaced in the direction of the track width (X-direction as shown), and therefore to more effectively improving the reproduction characteristics. In other words, as seen from FIG. 1, since the opposite end portions of the pinned magnetic layer 24 extended over regions beyond the track width Tw are positioned more distant from the free magnetic layer 26, it is possible to further weaken the effect, upon the free magnetic layer 26, of the demagnetizing fields generated from those regions of the pinned magnetic layer 24 extended beyond the track width Tw.

Stated otherwise, as shown in FIG. 1, the opposite end portions of the second hard magnetic layer 23 constituting the pinned magnetic layer 24 require to be etched away until reaching an intermediate depth point of the second hard magnetic layer 23 so that a central portion of the second hard magnetic layer 23 has a reduced width size comparable to the track width Tw. The reason resides in that the second hard magnetic layer 23 of the pinned magnetic layer 24 is a layer directly contributing to the magnetoresistive effect. By reducing the width size of the second hard magnetic layer 23 in the direction of the track width to a value approximately equal to the track width Tw at least until reaching an intermediate depth point of the second hard magnetic layer 23, the reproduction output can be satisfactorily increased. Also, by etching away the opposite end portions of the second hard magnetic layer 23 at least until reaching an intermediate depth point thereof, as indicated by the opposite end surfaces 31a, so that the second hard magnetic layer 23 left under the etched portions has a larger width size in the direction of the track width than the track width Tw, it is possible to properly generate the exchange coupling between the first hard magnetic layer 21 and the second hard magnetic layer 23 based on the RKKY interaction, and to properly bring the magnetizations of the first hard magnetic layer 21 and the second hard magnetic layer 23 into an antiparallel state.

The nonmagnetic material layer 25 is formed of a nonmagnetic electrically conductive material such as Cu, and it is preferably formed in a larger film thickness than the nonmagnetic material layer used in the related art. While in the related art the nonmagnetic material layer (corresponding to 25) has been formed in a film thickness of about 20 Å, the nonmagnetic material layer 25 in the embodiment of FIG. 1 is formed in a larger film thickness of about 50 Å to 100 Å. The reason resides in that, if the film thickness of the nonmagnetic material layer 25 is so thin as in the related art, the coercive force Hc of, in particular, the second hard magnetic layer 23 constituting the pinned magnetic layer 24, which is positioned closer to the free magnetic layer 26, is transferred to the free magnetic layer 26 and therefore the sensitivity of the free magnetic layer 26 to the external magnetic field is reduced. Further, when the magnetoresistive sensor is of CPP type like the embodiment shown in FIG. 1, there occurs no problem of reducing the product ($\Delta$RA) of a resistance change amount ($\Delta$R) and a sensor area (A) even if the film thickness of the nonmagnetic material layer 25 is set larger than that of the nonmagnetic material layer used in the magnetoresistive sensor of CIP type (in which a sensing current is supplied to flow in a direction parallel to the film surfaces of the multilayered film 31). In the embodiment shown in FIG. 1, therefore, the nonmagnetic material layer 25 is formed in a relatively large film thickness of not less than about 50 Å, but not more than about 100 Å.

A description is now made of materials of the free magnetic layer 26, a manner of controlling the magnetization, and so on. In the embodiment shown in FIG. 1, the free magnetic layer 26 is of a single-layer structure made of a magnetic material. The free magnetic layer 26 is preferably formed of NiFe or NiFeX (where X represents one or more elements selected from among Al, Si, Ti, V, Cr, Mn, Cu, Zr, Nb, Mo, Ru, Rh, Hf, Ta, W, Ir and Pt). The reason resides in that, if the free magnetic layer 26 is formed as a single-layer structure of CoFe, reproduction sensitivity would be low, hysteresis would deteriorate, and reproduction characteristics would be inferior to the case of forming the free magnetic layer 26 of NiFe or NiFeX.

The free magnetic layer 26 is formed in a film thickness of, e.g., 100 Å. Additionally, the film thickness of the free magnetic layer 26 is preferably not less than 40 Å, but not more than 150 Å.

Above the free magnetic layer 26, as shown in FIG. 1, the support ferromagnetic layer 28 and the antiferromagnetic layer 30 are successively formed in this order with the nonmagnetic layer 27 interposed therebetween.

The nonmagnetic layer 27 is formed of one or an alloy of two or more selected from among Ru, Rh, Ir, Cr, Re and Cu. In this embodiment the nonmagnetic layer 27 is formed in a film thickness of, e.g., 8 Å.

The support ferromagnetic layer 28 is formed of, e.g., NiFe, NiFeX (where X represents one or more elements selected from among Al, Si, Ti, V, Cr, Mn, Cu, Zr, Nb, Mo, Ru, Rh, Hf, Ta, W, Ir and Pt), CoFe, or CoFeCr. To increase an exchange coupling magnetic field generated between the support ferromagnetic layer 28 and the antiferromagnetic layer 30, the support ferromagnetic layer 28 of a single-layer structure is preferably formed of a ferromagnetic material containing Co. Also, the support ferromagnetic layer 28 is preferably formed in a film thickness of more than 0 Å, but not more than 30 Å.

The antiferromagnetic layer 30 is preferably formed of a PtMn alloy, an X—Mn alloy (where X represents one or more elements selected from among Pd, Ir, Rh, Ru and Os), or a Pt—Mn—X' alloy (where X' represents one or more elements selected from among Pd, Ir, Rh, Ru, Au, Ag, Os, Cr, Ni, Ar, Ne, Xe and Kr).

By using one of the above-mentioned alloys as the antiferromagnetic layer 30 and heat-treating it, an exchange coupling film comprising the support ferromagnetic layer 28 and the antiferromagnetic layer 30 and generating a large exchange coupling magnetic field can be obtained.

In the magnetoresistive sensor shown in FIG. 1, the direction of magnetization of the support ferromagnetic layer 28 is oriented and pinned in a direction crossing the direction of magnetization of the pinned magnetic layer 24 (i.e., the height direction) by the exchange coupling magnetic field generated between the support ferromagnetic layer 28 and the antiferromagnetic layer 30.

Further, because the free magnetic layer 26 is opposed to the support ferromagnetic layer 28 with the nonmagnetic layer 27 interposed therebetween, the free magnetic layer 26 is brought into a single domain state by the interlayer coupling magnetic field, i.e., the RKKY interaction in this case, through the support ferromagnetic layer 28 and the nonmagnetic layer 27, and the direction of magnetization of the free magnetic layer 26 is oriented in a direction crossing the direction of magnetization of the pinned magnetic layer 24. The magnetizations of the free magnetic layer 26 and the support ferromagnetic layer 28 are oriented in the same direction as that of the track width (X-direction as shown). Incidentally, the film thickness of the nonmagnetic layer 27 is preferably not less than 3 Å, but not more than 15 Å.

Thus, since the transition to the single domain state and the direction of magnetization of the free magnetic layer 26 are controlled by the interlayer coupling magnetic field generated between the free magnetic layer 26 and the support ferromagnetic layer 28 through the nonmagnetic layer 27, it is possible to suppress disturbance of the longitudinal bias magnetic field applied to the free magnetic layer 26 and hence disturbance of the domain structure of the free magnetic layer 26, which are otherwise caused by the external magnetic field such as the magnetic field leaked from the recording medium.

When the nonmagnetic layer 27 is made of Ru and an artificial ferri-state is established in which the directions of magnetizations of the free magnetic layer 26 and the support ferromagnetic layer 28 are made 180° different from each other, the film thickness of Ru is preferably in the range of 8 Å to 11 Å or in the range of 15 Å to 21 Å.

In the present invention, the exchange coupling magnetic field generated between the antiferromagnetic layer 30 and the support ferromagnetic layer 28 is increased to firmly pin the direction of magnetization of the support ferromagnetic layer 28 in a direction crossing the direction of magnetization of the pinned magnetic layer 24. In addition, by setting the magnitude of the interlayer coupling magnetic field generated between the free magnetic layer 26 and the support ferromagnetic layer 28 to be smaller than the exchange coupling magnetic field generated between the antiferromagnetic layer 30 and the support ferromagnetic layer 28, the free magnetic layer 26 is brought into a single domain state and the direction of magnetization of the free magnetic layer 26 is surely oriented in a direction orthogonal to the direction of magnetization of the pinned magnetic layer 24 while allowing the direction of magnetization of the free magnetic layer 26 to fluctuate with the leakage magnetic field.

To increase the exchange coupling magnetic field generated between the antiferromagnetic layer 30 and the support ferromagnetic layer 28 and to set the magnitude of the interlayer coupling magnetic field generated between the free magnetic layer 26 and the support ferromagnetic layer 28 to be smaller than the above exchange coupling magnetic field, the magnitude of magnetic moment (Ms×t; product of density of saturation magnetic flux and film thickness) per unit area of the support ferromagnetic layer 28 is set smaller than the magnitude of magnetic moment (Ms×t; product of density of saturation magnetic flux and film thickness) per unit area of the free magnetic layer 26 in this embodiment. More practically, a ratio of the magnitude of magnetic moment (Ms×t) per unit area of the free magnetic layer 26 to the magnitude of magnetic moment (Ms×t) per unit area of the support ferromagnetic layer 28 (i.e., Ms×t of the free magnetic layer 26/Ms×t of the support ferromagnetic layer 28 ) is preferably set to be in the range of not less than 3, but not more than 20.

In the magnetoresistive sensor shown in FIG. 1, control of the transition to the single domain state and the direction of magnetization of the free magnetic layer 26 can be adjusted in two stages, i.e., with the magnitude of the exchange coupling magnetic field generated between the antiferromagnetic layer 30 and the support ferromagnetic layer 28 and the magnitude of the interlayer coupling magnetic field generated between the support ferromagnetic layer 28 and the free magnetic layer 26, whereby fine control can be easily achieved.

Accordingly, it is possible to properly and easily control the transition to the single domain state and the direction of magnetization of the free magnetic layer 26, and to promote further narrowing of the track width in the magnetoresistive sensor.

Moreover, by employing the multilayered structure of the free magnetic layer 26/the nonmagnetic layer 27/the support ferromagnetic layer 28/the antiferromagnetic layer 30 as described above, the free magnetic layer 26 can be formed in a larger film thickness up to about 100 Å. As a result, the product (ΔRA) of the resistance change amount (ΔR) and the sensor area (A) can be further increased, and hence a further increase of the reproduction output can be achieved.

Figure 2:
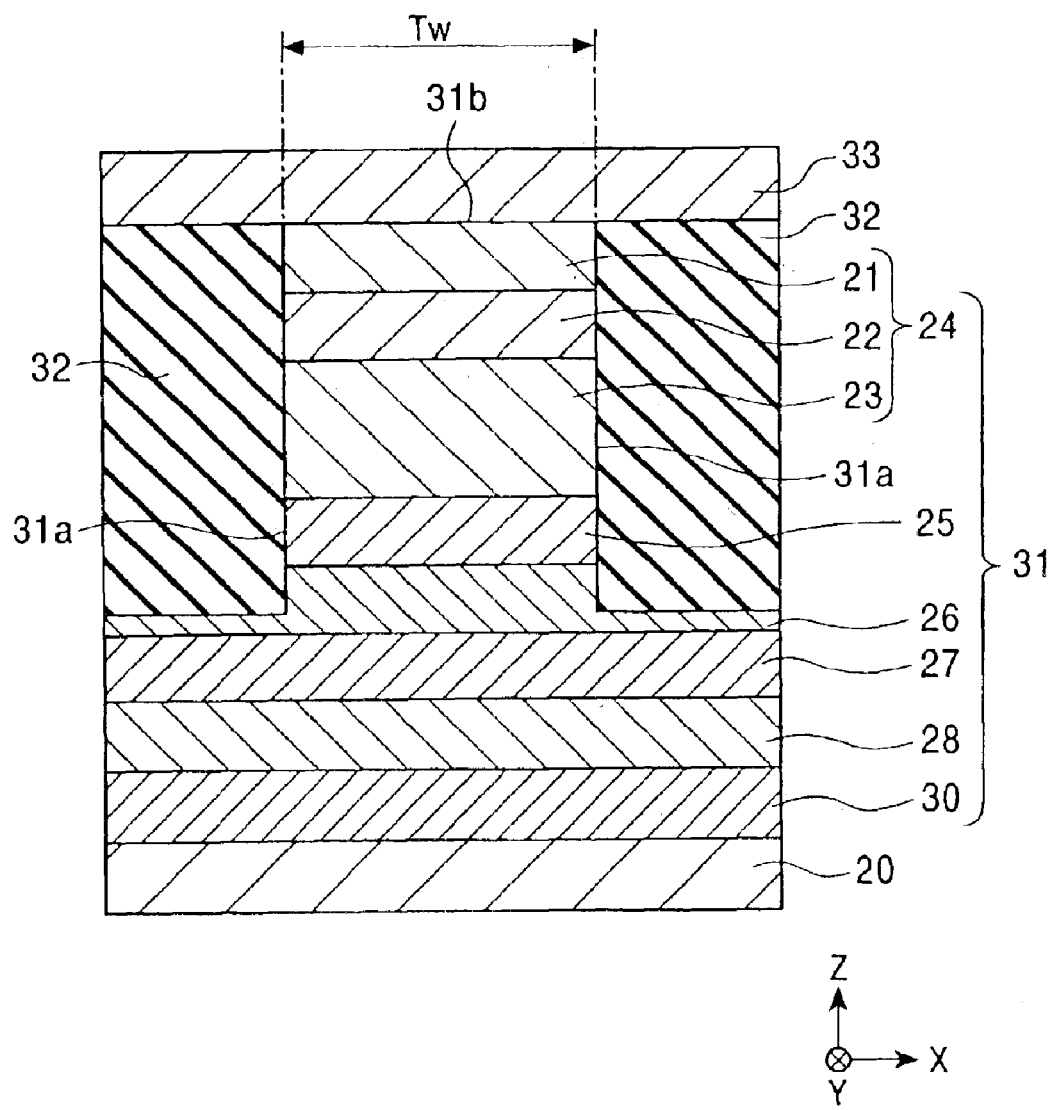
FIG. 2 is a sectional view of a magnetoresistive sensor according to a second embodiment of the present invention.

FIG. 2 is a partial sectional view, as viewed from the side of a sensor surface positioned to face a recording medium, of a magnetoresistive sensor according to a second embodiment of the present invention.

Of layers shown in FIG. 2, ones denoted by the same reference numerals as those in FIG. 1 represent the same layers as those in FIG. 1.

In the embodiment shown in FIG. 2, the layers constituting the multilayered film 31 shown in FIG. 1 are formed in a reversed order. More specifically, a multilayered film 31 of this embodiment is constituted by successively forming, on a lower shielding layer 20, an antiferromagnetic layer 30, a support ferromagnetic layer 28, a nonmagnetic layer 27, a free magnetic layer 26, a nonmagnetic material layer 25, a second hard magnetic layer 23, a nonmagnetic layer 22, and a first hard magnetic layer 21 in this order from the lowermost side.

In the embodiment shown in FIG. 2, the multilayered film 31 has opposite end surfaces 31a, 31a spaced in the direction of the track width (X-direction as shown), which are formed by etching opposite end portions of the multilayered film 31 from a top surface 31b downward until reaching an intermediate depth point of the free magnetic layer 26. A track width Tw is defined by a width size of the partly etched free magnetic layer 26 between the opposite end surfaces 31a and 31a spaced in the direction of the track width.

The reason why, in FIG. 2, opposite end portions of the free magnetic layer 26 are cut halfway by etching, as indicated by the opposite end surfaces 31a, while the opposite end portions of the free magnetic layer 26 on the lower side are not subjected to the etching and are formed to extend beyond the track width Tw, resides in properly generating interlayer coupling between the free magnetic layer 26 and the support ferromagnetic layer 28 and properly bringing the magnetization of the free magnetic layer 26 into a single domain state in the direction of the track width (X-direction as shown).

In the embodiment shown in FIG. 2, as in FIG. 1, the pinned magnetic layer 24 is formed in a three-layered structure comprising the first hard magnetic layer 21, the second hard magnetic layer 23, and the nonmagnetic layer 22 interposed between these two layers. Because the first hard magnetic layer 21 and the second hard magnetic layer 23 each have a strong coercive force Hc, the magnetizations of the layers 21, 23 are pinned by their own coercive forces Hc in a direction parallel to the height direction without utilizing the exchange coupling magnetic field generated at the interface between the pinned magnetic layer and the antiferromagnetic layer. In the embodiment shown in FIG. 2, the magnetizations of the first hard magnetic layer 21 and the second hard magnetic layer 23 are brought into an antiparallel state by exchange coupling generated between the first hard magnetic layer 21 and the second hard magnetic layer 23 based on the RKKY interaction.

With the structure of pinning the magnetizations of the first hard magnetic layer 21 and the second hard magnetic layer 23 by their own strong coercive forces Hc like the embodiment shown in FIG. 2, the magnetizations of the first hard magnetic layer 21 and the second hard magnetic layer 23 can be maintained in a pinned state by the strong coercive forces Hc even when their film thicknesses are increased, and therefore the first hard magnetic layer 21 and the second hard magnetic layer 23 can be formed in larger film thicknesses than those in the related art. Further, in the CPP-type magnetoresistive sensor shown in FIG. 2, since the film thickness of the pinned magnetic layer 24 can be increased, the product (ΔRA) of the resistance change amount (ΔR) and the sensor area (A) in a plane parallel to the film surfaces can be increased and hence a further increase of the reproduction output is expected.

Also, in the embodiment shown in FIG. 2, since the pinned magnetic layer 24 is made up of the first hard magnetic layer 21 and the second hard magnetic layer 23 each having a strong coercive force Hc without utilizing the exchange coupling magnetic field generated at the interface between the pinned magnetic layer and the antiferromagnetic layer for control of the magnetization of the pinned magnetic layer 24, the magnetizations of the hard magnetic layers 21, 23 can be controlled by applying a magnetic field without heat treatment. Under the effect of the magnetic field applied for the magnetization control of the hard magnetic layers 21, 23, the magnetization of the free magnetic layer 26 is temporarily oriented in the same direction as that of the applied magnetic field. However, because, as described later, an appropriate level of interlayer coupling acts between the free magnetic layer 26 and the support ferromagnetic layer 28, the magnetization of the free magnetic layer 26 is returned again to the direction of the track width (X-direction as shown) upon release of the applied magnetic field. Consequently, the magnetization of the free magnetic layer 26 and the magnetization of the pinned magnetic layer 24 are properly held in an orthogonal state.

In the embodiment shown in FIG. 2, therefore, the magnetizations of the pinned magnetic layer 24 and the free magnetic layer 26 can be more easily and reliably can be made orthogonal to each other in comparison with the related art.

In the embodiment shown in FIG. 2, it is thought that demagnetizing fields generated from ends of the pinned magnetic layer 24 are increased in comparison with those in the embodiment shown in FIG. 1. The reason resides in that, as shown in FIG. 2, the first hard magnetic layer 21 and the second hard magnetic layer 23 constituting the pinned magnetic layer 24 have the opposite end surfaces 31 a spaced in the direction of the track width (X-direction as shown), which are entirely given as continuous surfaces formed by etching. However, because FIG. 2 employs the multilayered structure made up of the two hard magnetic layers 21, 23 with the nonmagnetic layer 22 interposed therebetween, the demagnetizing fields affecting the direction of magnetization of the free magnetic layer can be weakened in comparison with the case of constituting the pinned magnetic layer 24 as a single hard magnetic layer alone.

Figure 3:
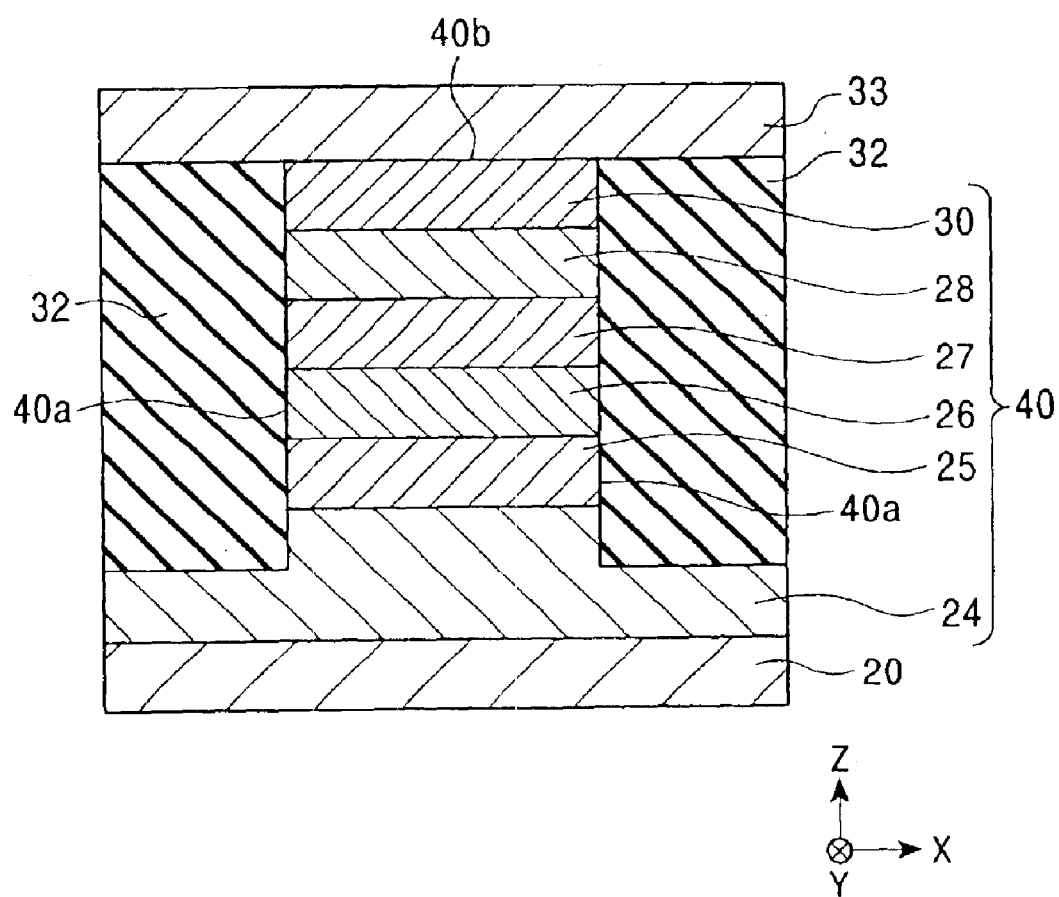
FIG. 3 is a sectional view of a magnetoresistive sensor according to a third embodiment of the present invention.

FIG. 3 is a partial sectional view, as viewed from the side of a sensor surface positioned to face a recording medium, of a magnetoresistive sensor according to a third embodiment of the present invention.

In the magnetoresistive sensor shown in FIG. 3, layers denoted by the same reference numerals as those in FIG. 1 represent the same layers as those in FIG. 1. In the embodiment shown in FIG. 3, unlike the embodiments shown in FIG. 1 and 2, the pinned magnetic layer 24 is formed as a single hard magnetic material layer alone. Reference numeral 40 denotes a multilayered film. Characteristics required for the hard magnetic material layer are as per described above in connection with FIG. 1. In the embodiment shown in FIG. 3, however, since the pinned magnetic layer 24 is formed in a single-layer structure of the hard magnetic material layer, the coercive force Hc of the pinned magnetic layer 24 cannot be increased up to a level obtained with the magnetoresistive sensors shown in FIGS. 1 and 2 (see FIG. 8).

In spite of such a disadvantage, by forming the pinned magnetic layer 24 of a hard magnetic material having a strong coercive force Hc, such as a CoPt alloy, the magnetization of the pinned magnetic layer 24 can be properly pinned even with the pinned magnetic layer 24 being of a single-layer structure.

Also, since the pinned magnetic layer 24 is formed in a single-layer structure of the hard magnetic material layer, the magnitude of demagnetizing fields generated from ends of the pinned magnetic layer 24 cannot be reduced so effectively as in the embodiment shown in FIG. 1. However, by etching the multilayered film 40 to define opposite end surfaces 40a until reaching an intermediate depth point of the pinned magnetic layer 24 so that opposite-end regions of the pinned magnetic layer 24 nearer to its lower surface are formed to extend beyond the opposite end surfaces 40a in the direction of the track width (X-direction as shown), as shown in FIG. 3, the opposite end regions of the pinned magnetic layer 24 nearer to its lower surface are positioned more distant away from the free magnetic layer 26, it is possible to weaken the effect, upon the free magnetic layer 26, of the demagnetizing fields generated from the opposite end portions of the pinned magnetic layer 24.

Figure 4:
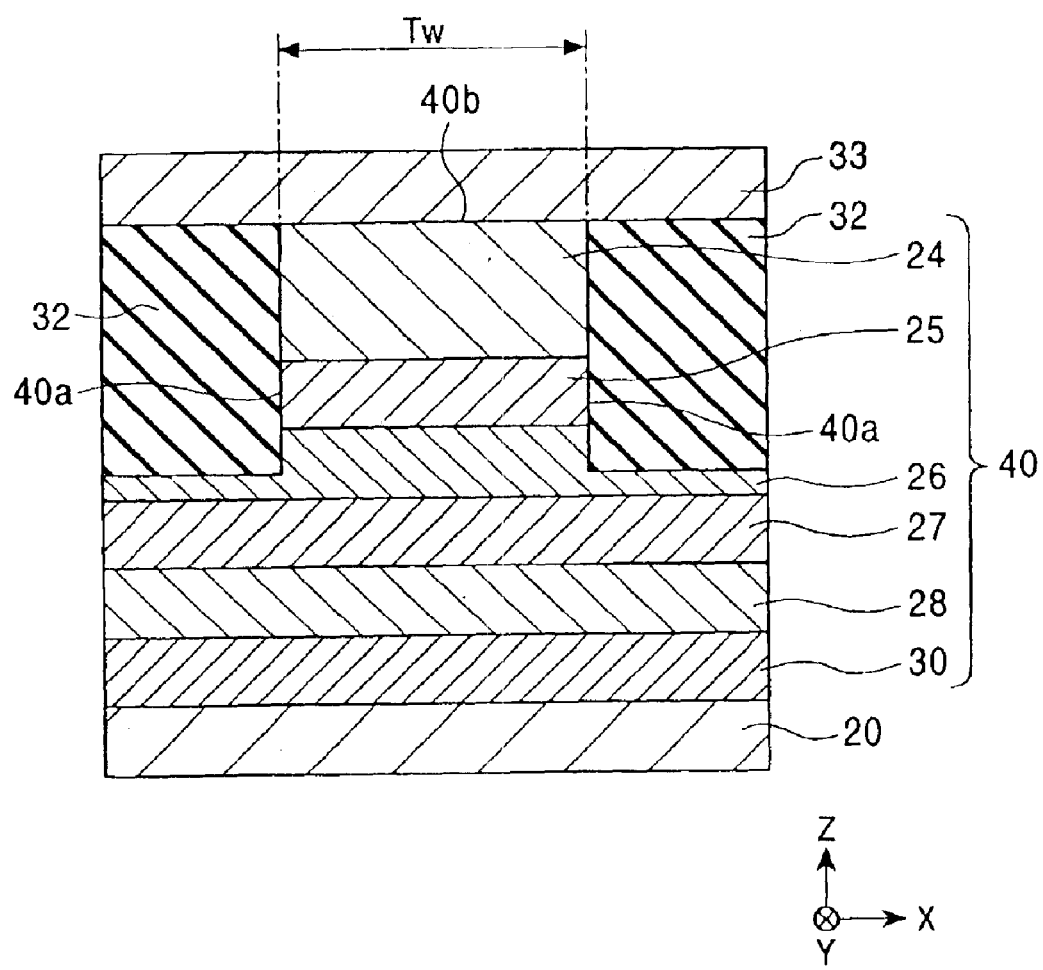
FIG. 4 is a sectional view of a magnetoresistive sensor according to a fourth embodiment of the present invention.

FIG. 4 is a partial sectional view, as viewed from the side of a sensor surface positioned to face a recording medium, of a magnetoresistive sensor according to a fourth embodiment of the present invention.

In the embodiment shown in FIG. 4, the layers constituting the multilayered film 40 shown in FIG. 3 are formed in a reversed order. More specifically, a multilayered film 40 of this embodiment is constituted by successively forming, on a lower shielding layer 20, an antiferromagnetic layer 30, a support ferromagnetic layer 28, a nonmagnetic layer 27, a free magnetic layer 26, a nonmagnetic material layer 25, and a pinned magnetic layer 24 in this order from the lowermost side.

In the embodiment shown in FIG. 4, the multilayered film 31 has opposite end surfaces 40a, 40a spaced in the direction of the track width (X-direction as shown), which are formed by etching opposite end portions of the multilayered film 40 from a top surface 40b downward until reaching an intermediate depth point of the free magnetic layer 26. A track width Tw is defined by a width size of the partly etched free magnetic layer 26 between the opposite end surfaces 40a and 40a spaced in the direction of the track width.

In the embodiment shown in FIG. 4, it is thought that the effects of demagnetizing fields generated from ends of the pinned magnetic layer 24 upon the free magnetic layer 26 are increased in comparison with those in the embodiments shown in FIGS. 1 and 3. The reason resides in that, as shown in FIG. 4, the pinned magnetic layer 24 has a single-layer structure of a hard magnetic material layer and the pinned magnetic layer 24 has the opposite end surfaces 40a, which are given as continuous surfaces formed by etching throughout from an upper surface to a lower surface thereof.

Accordingly, the film structure of the pinned magnetic layer 24 is preferably formed as a three-layered structure made up of the first hard magnetic layer 21 and the second hard magnetic layer 23 with the nonmagnetic layer 22 interposed therebetween as shown in FIGS. 1 and 2. Even with the embodiments shown in FIGS. 3 and 4, however, as with the embodiments shown in FIGS. 1 and 2, because the pinned magnetic layer 24 is formed of a hard magnetic material having a strong coercive force Hc, the magnetization of the pinned magnetic layer 24 is pinned by its own strong coercive force Hc in a direction parallel to the height direction without utilizing the exchange coupling magnetic field generated at the interface between the pinned magnetic layer and the antiferromagnetic layer. Then, with the structure of pinning the magnetization of the pinned magnetic layer 24 by its own strong coercive forces Hc like the embodiments shown in FIGS. 3 and 4, the magnetization of the pinned magnetic layer 24 can be maintained in a pinned state by the strong coercive forces Hc even when its film thickness is increased, and therefore the pinned magnetic layer 24 can be formed in a larger film thickness than that in the related art. Further, in the CPP-type magnetoresistive sensors shown in FIGS. 3 and 4, since the film thickness of the pinned magnetic layer 24 can be increased, the product (ΔRA) of the resistance change amount (ΔR) and the sensor area (A) in a plane parallel to the film surfaces can be increased and hence a further increase of the reproduction output is expected.

Also, in the embodiments shown in FIGS. 3 and 4, since the pinned magnetic layer 24 is formed of a hard magnetic material having a strong coercive force Hc without utilizing the exchange coupling magnetic field generated at the interface between the pinned magnetic layer and the antiferromagnetic layer for control of the magnetization of the pinned magnetic layer 24, the magnetization of the pinned magnetic layer 24 can be controlled by applying a magnetic field without heat treatment. Under the effect of the magnetic field applied for the magnetization control of the pinned magnetic layer 24, the magnetizations of the free magnetic layer 26 and the support ferromagnetic layer 28 are temporarily oriented in the same direction as that of the applied magnetic field. However, because an appropriate level of interlayer coupling acts between the free magnetic layer 26 and the support ferromagnetic layer 28 and an exchange coupling magnetic field acts between the support ferromagnetic layer 28 and the antiferromagnetic layer 30, the magnetizations of the free magnetic layer 26 and the support ferromagnetic layer 28 are returned again to the direction of the track width (X-direction as shown) upon release of the applied magnetic field. Consequently, the magnetization of the free magnetic layer 26 and the magnetization of the pinned magnetic layer 24 are properly held in an orthogonal state.

In the embodiments shown in FIGS. 3 and 4, therefore, the magnetizations of the pinned magnetic layer 24 and the free magnetic layer 26 can be more easily and reliably can be made orthogonal to each other in comparison with the related art.

Figure 5:
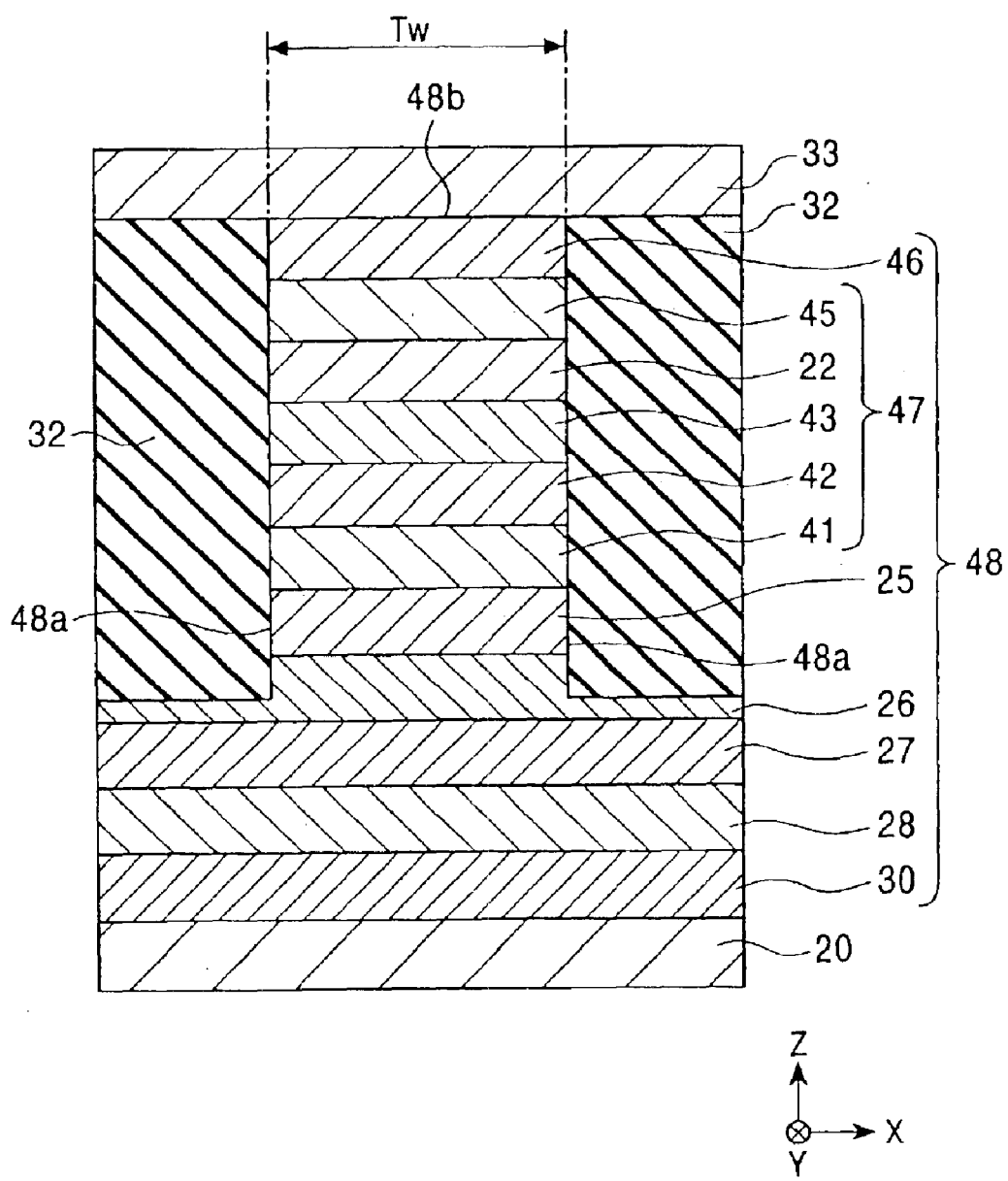
FIG. 5 is a sectional view of a magnetoresistive sensor according to a fifth embodiment of the present invention.

FIG. 5 is a partial sectional view, as viewed from the side of a sensor surface positioned to face a recording medium, of a magnetoresistive sensor according to a fifth embodiment of the present invention. Note that, when layers constituting the magnetoresistive sensor shown in FIG. 5 are denoted by the same reference numerals as those denoting the layers constituting the magnetoresistive sensor shown in FIG. 1, the reference numerals represent the same layers as those in FIG. 1.

The embodiment shown in FIG. 5 differs from the magnetoresistive sensors shown in FIGS. 1 to 4 in a manner of controlling magnetization of a pinned magnetic layer 47.

In the embodiment shown in FIG. 5, an antiferromagnetic layer 30, a support ferromagnetic layer 28, a nonmagnetic layer 27, a free magnetic layer 26, and a nonmagnetic material layer 25 are successively formed on a lower shielding layer 20 in this order. This multilayered structure is the same as that shown in embodiment FIG. 2.

In the embodiment shown in FIG. 5, the pinned magnetic layer 47 formed on nonmagnetic material layer 25 is of a five-layered structure comprising a third ferromagnetic layer 41, a hard magnetic layer 42, a second ferromagnetic layer 43, a nonmagnetic layer 22, and a first ferromagnetic layer 45, which are successively formed in this order from the lower side. Then, a first antiferromagnetic layer 46 is formed on the first ferromagnetic layer 45. A multilayered structure from the antiferromagnetic layer 30 to the first antiferromagnetic layer 46 constitutes a multilayered film 48.

In the embodiment shown in FIG. 5, when the first ferromagnetic layer 45 is magnetized in the height direction (Y-direction as shown), for example, by an exchange coupling magnetic field generated between the first antiferromagnetic layer 46 and the first ferromagnetic layer 45, the magnetizations of the second ferromagnetic layer 43, the hard magnetic layer 42, and the third ferromagnetic layer 41 are oriented and pinned in a direction opposed to the height direction (i.e., direction opposed to the Y-direction as shown) through the nonmagnetic layer 22. Thus, the magnetization of the first ferromagnetic layer 45 and the magnetizations of the second ferromagnetic layer 43, the hard magnetic layer 42, and the third ferromagnetic layer 41 are brought into an antiparallel state.

In the embodiment shown in FIG. 5, the pinned magnetic layer 47 includes the hard magnetic layer 42 having a strong coercive force Hc. Therefore, even when the hard magnetic layer 42 is formed in a larger film thickness, the magnetizations of the second ferromagnetic layer 43, the hard magnetic layer 42, and the third ferromagnetic layer 41 can be reliably oriented and pinned in the direction opposed to the height direction.

In this embodiment, the hard magnetic layer 42 can be formed in a large film thickness of not less than 30 Å, but not more than 200 Å. Characteristics required for the hard magnetic layer 42 are as per described above in connection with FIG. 1, i.e., a strong coercive force Hc, a high β value, and a high specific resistance value ρ. More specifically, the coercive force Hc is preferably not less than $15.8 \times 10^3$ (A/m) [=200 Oe]. This condition enables the magnetizations of the above three layers 41, 42 and 43 to be reliably oriented and pinned in the direction opposed to the height direction. Also, the β value is preferably not smaller than 0.3 in absolute value, and the specific resistance value ρ is preferably not smaller than 30 ($\mu\Omega$·cm). By satisfying those conditions, a magnetoresistive sensor is manufactured which can increase ΔRA based on the above-mentioned formula (1) and can achieve a higher reproduction output than that in the related art.

Furthermore, in the embodiment shown in FIG. 5, unlike the embodiments shown in FIGS. 1 to 4, the first antiferromagnetic layer 46 is employed and the magnetization of the pinned magnetic layer 47 is pinned by utilizing the exchange coupling magnetic field generated between the first antiferromagnetic layer 46 and the first ferromagnetic layer 45 as well. However, the magnetizations of the free magnetic layer 26 and the pinned magnetic layer 47 can be more easily and reliably brought into an orthogonal state than in the conventional magnetoresistive sensor shown in FIG. 14.

The reason resides in that the pinned magnetic layer 47 includes the hard magnetic layer 42 having a strong coercive force Hc. By controlling the magnetization of the pinned magnetic layer 47 with a manner of, for example, applying a magnetic field to the hard magnetic layer 42 to magnetize the hard magnetic layer 42 in the height direction before performing heat treatment under a magnetic field to generate the exchange coupling magnetic field between the first antiferromagnetic layer 46 and the first ferromagnetic layer 45, the magnetizations of the second ferromagnetic layer 43, the hard magnetic layer 42, and the third ferromagnetic layer 41 can be properly developed and pinned even when the magnitude of a magnetic field to be applied in the subsequent heat treatment under the magnetic field is set smaller than that required in the related art.

In spite of performing the heat treatment under the magnetic field to generate the exchange coupling magnetic field between the first antiferromagnetic layer 46 and the first ferromagnetic layer 45, therefore, a resulting effect upon the support ferromagnetic layer 28 and the free magnetic layer 26 is small because the magnetizations of these two layers have already been oriented in a direction parallel to the direction of the track width (X-direction as shown). As a result, a disturbance on the direction of magnetization of the free magnetic layer 26, otherwise caused by the heat treatment under the magnetic field, can be more satisfactorily suppressed than in the related art.

Thus, in the embodiment shown in FIG. 5, although the heat treatment under the magnetic field is performed in a step of controlling the magnetization of the pinned magnetic layer 47, the magnetizations of the free magnetic layer 26 and the pinned magnetic layer 47 can be more easily and reliably brought into an orthogonal state than in the related art.

Material properties, etc. required for the pinned magnetic layer 47 and the first antiferromagnetic layer 46 will be described below.

In the first ferromagnetic layer 45, preferably, a region containing an element Z (where Z represents at least one element selected from among Cr, Ti, V, Zr, Nb, Mo, Hf, Ta and W) is present in a portion locating from the interface with the first antiferromagnetic layer 46 toward the nonmagnetic layer 22, and a region not containing the element Z is present in a part of a region locating from the interface with the nonmagnetic layer 22 toward the first antiferromagnetic layer 46.

More specifically, it is preferable that the first ferromagnetic layer 45 be formed of primarily a CoFe alloy, the region containing the element Z be formed of a CoFeZ alloy, and the region not containing the element Z be formed of a CoFe alloy. These compositions contributes to not only enhancing the exchange coupling magnetic field generated between the first antiferromagnetic layer 46 and the first ferromagnetic layer 45, but also to enhancing the exchange coupling generated between the second ferromagnetic layer 43 and the first ferromagnetic layer 45 through the nonmagnetic layer 22 based on the RKKY interaction.

As an alternative, the first ferromagnetic layer 45 may be formed, for example, of a two-layered structure having a clearly appearing interface, in which one of two layers formed nearer to the first antiferromagnetic layer 46 is formed of a CoFeZ alloy and the other layer formed nearer to the nonmagnetic layer 22 is formed of a CoFe alloy.

Further, in the embodiment shown in FIG. 5, the second ferromagnetic layer 43 is preferably formed of a CoFe alloy. While the second ferromagnetic layer 43 may be formed of another material such as a NiFe alloy, it is preferably formed of a CoFe alloy from the viewpoints of enhancing the exchange coupling generated between the second ferromagnetic layer 43 and the first ferromagnetic layer 45 based on the RKKY interaction and preventing diffusion of the elements. As an alternative, the second ferromagnetic layer 43 may be dispensed with.

The third ferromagnetic layer 41 is also preferably formed of a CoFe alloy. By forming the third ferromagnetic layer 41 of a CoFe alloy, the magnetization of the third ferromagnetic layer 41 can be more satisfactorily pinned in the height direction. Further, diffusion of the elements can be effectively prevented and a magnetoresistive sensor having a higher reproduction output can be manufactured. As an alternative, the third ferromagnetic layer 41 may be dispensed with.

The hard magnetic layer 42 is, as described above in connection with FIG. 1, preferably formed of a CoPt alloy, a CoPtX alloy (where X represents one or more noble metals selected from among Ru, Re, Pd, Os, Ir, Pt, Au and Rh), or a CoPtY alloy (where Y represents one or more elements selected from among Sc, Ti, V, Cr, Mn, Fe, Co, Ni and Cu).

Because the pinned magnetic layer 47 in the embodiment shown in FIG. 5 is of an artificial ferri-structure, the value of magnetic moment (saturation magnetization Ms×film thickness t) per unit area of the first ferromagnetic layer 45 requires to be different from the value of total magnetic moment given by the sum of magnetic moments per unit area of the second ferromagnetic layer 43, the hard magnetic layer 42 and the third ferromagnetic layer 41.

Moreover, in the embodiment shown in FIG. 5, the first antiferromagnetic layer 46 is preferably formed of a PtMn alloy, an X—Mn alloy (where X represents one or more elements selected from among Pd, Ir, Rh, Ru and Os), or a Pt—Mn—X' alloy (where X' represents one or more elements selected from among Pd, Ir, Rh, Ru, Au, Ag, Os, Cr, Ni, Ar, Ne, Xe and Kr).

By using one of the above-mentioned alloys as the first antiferromagnetic layer 46 and heat-treating it, an exchange coupling film comprising the first antiferromagnetic layer 46 and the first ferromagnetic layer 45 and generating a large exchange coupling magnetic field can be obtained.

In the embodiment shown in FIG. 5, the multilayered film 48 has opposite end surfaces 48a, which are formed by etching opposite end portions of the multilayered film 48 from a top surface 48b downward until reaching an intermediate depth point of the free magnetic layer 26. A track width Tw is defined by a width size of the etched opposite end portions between the free magnetic layer 26 spaced in the direction of the track width.

In the embodiment shown in FIG. 5, insulating layers 32 are formed on both sides of the multilayered film 48 to cover the opposite end surfaces 48a thereof. An upper shielding layer 33 serving also as an upper electrode is formed to cover the top surface 48b of the multilayered film 48 and upper surfaces of the insulating layers 32.

Figure 6:
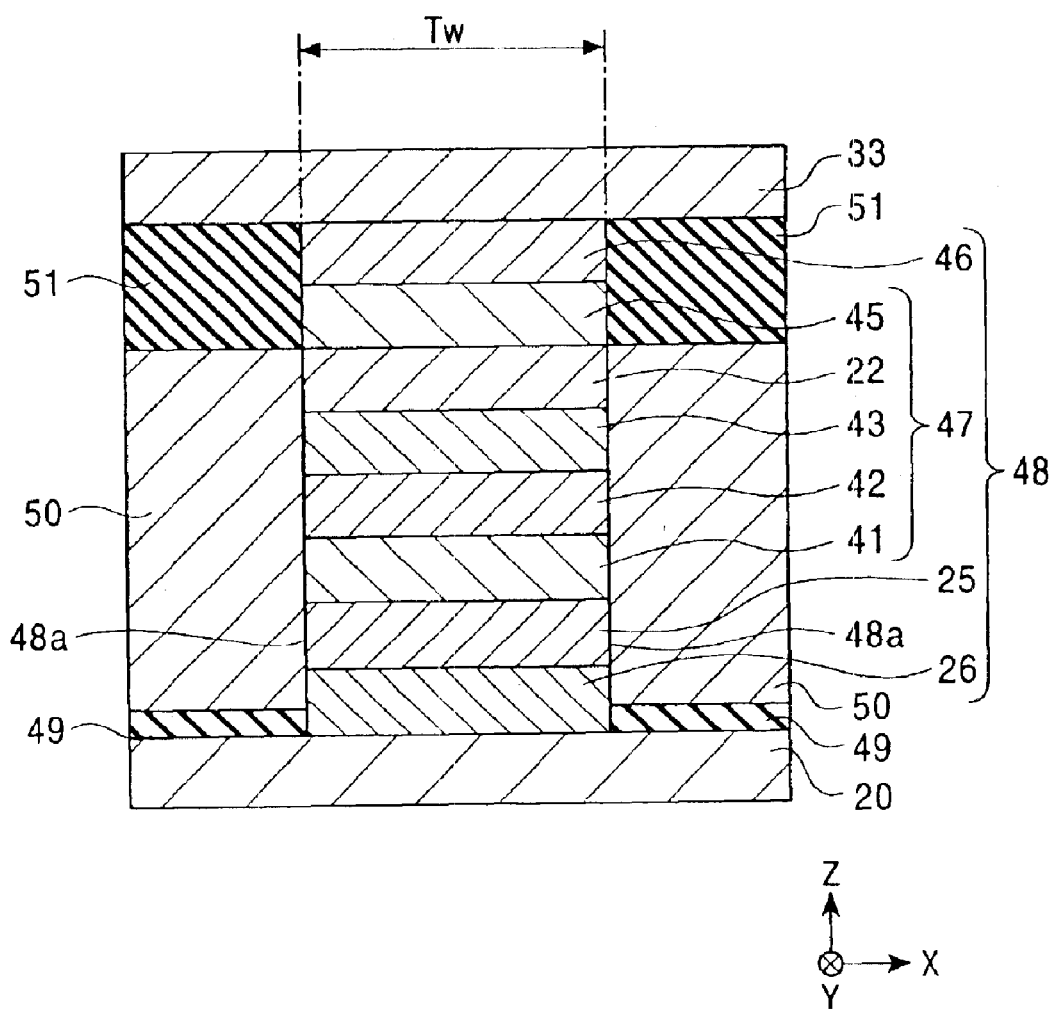
FIG. 6 is a sectional view of a magnetoresistive sensor according to a sixth embodiment of the present invention.

FIG. 6 is a partial sectional view, as viewed from the side of a sensor surface positioned to face a recording medium, of a magnetoresistive sensor according to a sixth embodiment of the present invention. In FIG. 6, layers denoted by the same reference numerals as those in FIG. 5 represent the same layers as those in FIG. 5.

In the magnetoresistive sensor of FIG. 6, on a lower shielding layer 20 serving also as a lower electrode, a free magnetic layer 26, a nonmagnetic material layer 25, a third ferromagnetic layer 41, a hard magnetic layer 42, a second ferromagnetic layer 43, a nonmagnetic layer 22, a first ferromagnetic layer 45, and a first antiferromagnetic layer 46 are successively formed in this order from the lower side. A multilayered structure from the free magnetic layer 26 to the first antiferromagnetic layer 46 constitutes a multilayered film 48.

As shown in FIG. 6, the multilayered film 48 has opposite end surfaces 48a spaced in the direction of the track width (X-direction), which are continuous surfaces formed by etching opposite end portions of the multilayered film 48 from a top surface downward. A track width Tw is defined by a width size between the opposite end surfaces 48a spaced in the direction of the track width and extending to midway the free magnetic layer 26.

As shown in FIG. 6, the lower shielding layer 20 is formed to extend beyond the opposite end surfaces 48a of the multilayered layer 48 in the direction of the track width, an insulating layer 49, a hard bias layer 50, and an insulating layer 51 are successively formed in this order from the lower side on each of opposite extended portions of the lower shielding layer 20 so as to cover the opposite end surfaces 48a of the multilayered layer 48.

The insulating layer 49 and the insulating layer 51 are each formed of an insulating material such as $Al_2O_3$ and $SiO_2$. The hard bias layer 50 is formed of, e.g., a CoPt alloy or a CoPtCr alloy.

In the embodiment shown in FIG. 6, unlike the embodiments shown in FIGS. 1 to 5, the direction of magnetization of the free magnetic layer 26 is controlled by a longitudinal bias magnetic field applied from the hard bias layers 50.

The hard bias layers 50 are magnetized in the direction of the track width (X-direction as shown). A longitudinal bias magnetic field is supplied to the free magnetic layer 26 in the direction of the track width from the hard bias layers 50. The magnetization of the free magnetic layer 26 is put in order in the direction of the track width and is weakly put into a single domain state to such an extent that the magnetization is reversible with an external magnetic field.

In the embodiment shown in FIG. 6, when the first ferromagnetic layer 45 is magnetized in the height direction (Y-direction as shown), for example, by an exchange coupling magnetic field generated between the first antiferromagnetic layer 46 and the first ferromagnetic layer 45, the magnetizations of the second ferromagnetic layer 43, the hard magnetic layer 42, and the third ferromagnetic layer 41 are oriented and pinned in a direction opposed to the height direction (i.e., direction opposed to the Y-direction as shown) through the nonmagnetic layer 22. Thus, the magnetization of the first ferromagnetic layer 45 and the magnetizations of the second ferromagnetic layer 43, the hard magnetic layer 42, and the third ferromagnetic layer 41 are brought into an antiparallel state.

In the embodiment shown in FIG. 6, the pinned magnetic layer 47 includes the hard magnetic layer 42 having a strong coercive force Hc. Therefore, even when the hard magnetic layer 42 is formed in a larger film thickness, the magnetizations of the second ferromagnetic layer 43, the hard magnetic layer 42, and the third ferromagnetic layer 41 can be reliably oriented and pinned in the direction opposed to the height direction.

In this embodiment, the hard magnetic layer 42 can be formed in a large film thickness of not less than 30 Å, but not more than 200 Å. Characteristics required for the hard magnetic layer 42 are as per described above in connection with FIG. 1, i.e., a strong coercive force Hc, a high β value, and a high specific resistance value ρ. More specifically, the coercive force Hc is preferably not less than $15.8\times10^3$ (A/m) [=200 Oe]. This condition enables the magnetization of the hard magnetic layer 42 to be reliably oriented and pinned in the direction opposed to the height direction. Also, the β value is preferably not smaller than 0.3 in absolute value, and the specific resistance value ρ is preferably not smaller than 30 ($\mu\Omega\cdot$cm). By satisfying those conditions, a magnetoresistive sensor is manufactured which can increase ΔRA based on the above-mentioned formula (1) and can achieve a higher reproduction output than that in the related art.

Furthermore, in the embodiment shown in FIG. 6, the hard bias layers 50 are employed to control the magnetization of the free magnetic layer 26. In this case, if the pinned magnetic layer 47 is constituted by one or more hard magnetic layers alone as shown in FIGS. 1 to 4 without employing the first antiferromagnetic layer 46 to pin the magnetization of the pinned magnetic layer 47, the magnetizations of the free magnetic layer 26 and the pinned magnetic layer 47 cannot be satisfactorily brought into an orthogonal state.

Figure 12:
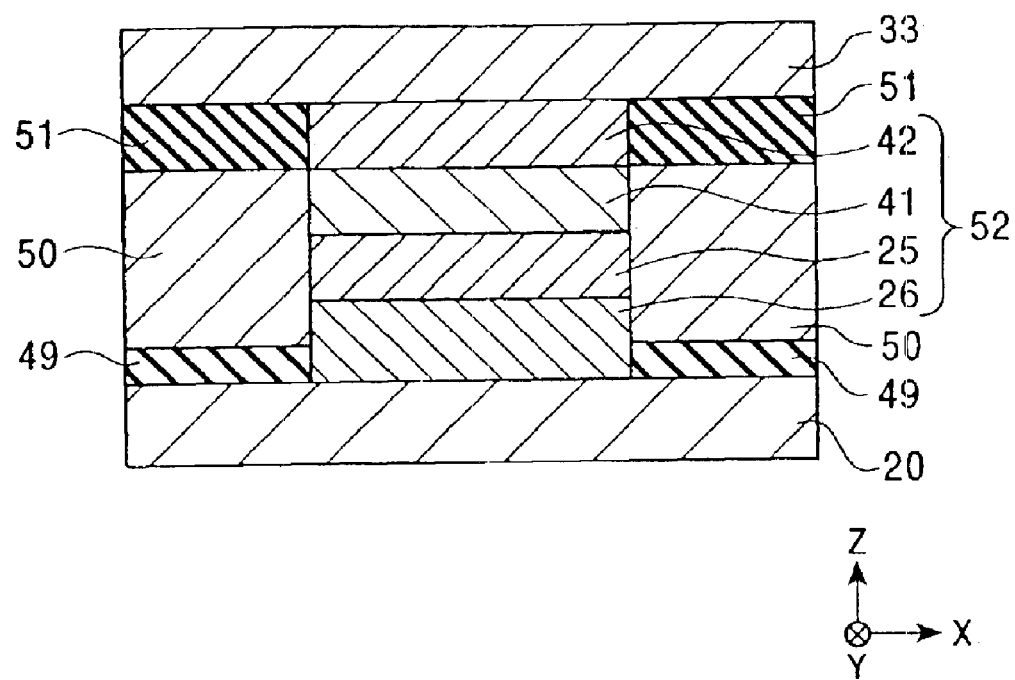
FIG. 12 is a sectional view of a magnetoresistive sensor as a comparative example.

FIG. 12 is a partial sectional view, as viewed from the side of a sensor surface positioned to face a recording medium, of a magnetoresistive sensor as a comparative example. In FIG. 12, layers denoted by the same reference numerals as those in FIG. 6 represent the same layers as those in FIG. 6. In the comparative example shown in FIG. 12, on a lower shielding layer 20, a free magnetic layer 26, a nonmagnetic material layer 25, a third ferromagnetic layer 41, and a hard magnetic layer 42 are successively formed in this order from the lower side. A multilayered structure from the free magnetic layer 26 to the hard magnetic layer 42 constitutes a multilayered film 52. Thus, only one layer, i.e., the hard magnetic layer 42, constitutes the pinned magnetic layer (hereinafter referred to also as "the pinned magnetic layer 42"), and the first antiferromagnetic layer 46 for controlling the magnetization of the pinned magnetic layer is not used unlike the embodiment of FIG. 6.

Additionally, in FIG. 6, the hard bias layers 50 are positioned to face opposite end surfaces of the free magnetic layer 26 spaced in the direction of the track width, and the magnetization of the free magnetic layer 26 is brought into a single domain state in the X-direction as shown by the longitudinal bias magnetic field applied form the hard bias layers 50.

In the above-described film structure shown in FIG. 12, it is difficult to satisfactorily bring the free magnetic layer 26 and the hard magnetic layer 42 (pinned magnetic layer) into an orthogonal state.

The reason resides in that the exchange coupling magnetic field resulting from the provision of the antiferromagnetic layer is not utilized to control the magnetization of the pinned magnetic layer 42. To explain a manner of bringing the magnetizations into an orthogonal state in more detail in FIG. 12, after finishing the steps until forming the multilayered film 52, a magnetic field is first applied in the height direction (Y-direction as shown) without heat treatment for fixedly magnetizing the pinned magnetic layer 42. The magnetization of the pinned magnetic layer 42 is thereby oriented and pinned in the height direction (Y-direction as shown) because of having a strong coercive force Hc. Then, after forming the hard bias layers 50, a magnetic field is applied to the hard bias layers 50 in the direction of the track width (X-direction as shown) without heat treatment. At this time, under the effect of the applied magnetic field, the magnetization of the pinned magnetic layer 42, which has been pinned in the height direction, is changed to orient in the direction of the track width, or is brought into a multi-domain state although it is not fully oriented in the direction of the track width. Consequently, it is difficult to make the magnetization of the free magnetic layer 26 and the magnetization of the pinned magnetic layer 42 cross each other in an orthogonal state.

Stated otherwise, when the antiferromagnetic layer is not employed in both the free magnetic layer 26 and the pinned magnetic layer 42 to control the magnetizations of these two layers as in FIG. 12, a difficulty occurs in bringing the magnetization of the free magnetic layer 26 and the magnetization of the pinned magnetic layer 42 into an orthogonal state, and a magnetoresistive sensor having satisfactory reproduction characteristics cannot be manufactured.

On the other hand, in the embodiment shown in FIG. 6, the magnetization of the free magnetic layer 26 is controlled by the longitudinal bias magnetic field applied from the hard bias layers 50, while the exchange coupling magnetic field generated between the first antiferromagnetic layer 46 formed on the pinned magnetic layer 47 and the first ferromagnetic layer 45 is utilized to control the magnetization of the pinned magnetic layer 47. It is hence possible to satisfactorily bring the magnetization of the free magnetic layer 26 and the magnetization of the pinned magnetic layer 47 into an orthogonal state.

More specifically, in the embodiment shown in FIG. 6, by performing heat treatment under a magnetic field after finishing the steps until forming the multilayered film 48, an exchange coupling magnetic field is generated between the first antiferromagnetic layer 46 and the first ferromagnetic layer 45 to pin the magnetization of the first ferromagnetic layer 45 in the height direction (Y-direction as shown). Correspondingly, the magnetizations of the second ferromagnetic layer 43, the hard magnetic layer 42, and the third ferromagnetic layer 41 are reversed to a direction opposed to the height direction by exchange coupling based on the RKKY interaction and are pinned in the direction opposed to the height direction. Then, after forming the hard bias layers 50, when a magnetic field is applied in the X-direction as shown to magnetize the hard bias layers 50, the directions of magnetization of the first ferromagnetic layer 45, the second ferromagnetic layer 43, the hard magnetic layer 42, and the third ferromagnetic layer 41 fluctuate under the effect of the applied magnetic field. Upon release of the applied magnetic field, however, the magnetization of the first ferromagnetic layer 45 is returned to and pinned in the height direction (Y-direction as shown), while the magnetizations of the second ferromagnetic layer 43, the hard magnetic layer 42, and the third ferromagnetic layer 41 are returned to and pinned in the direction opposed to the height direction with the action of exchange coupling based on the exchange coupling magnetic field and the RKKY interaction.

Figure 7:
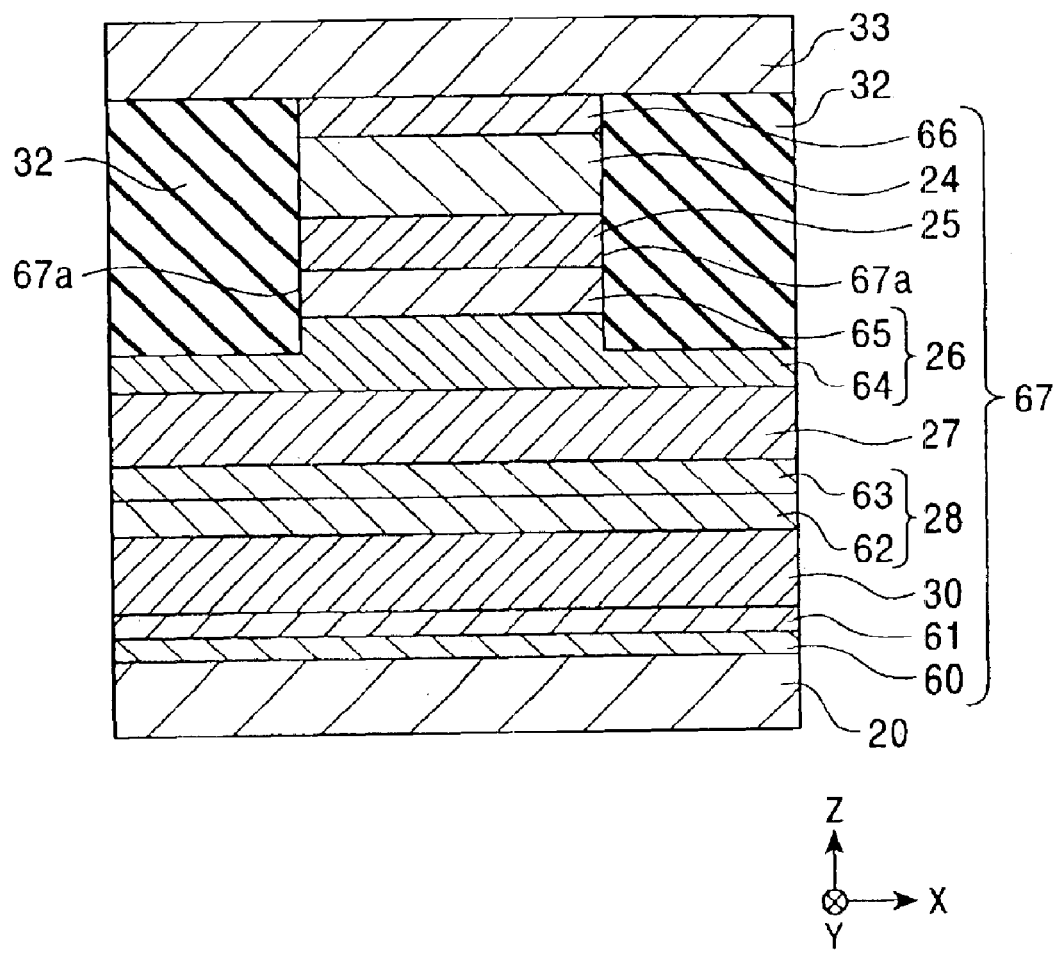
FIG. 7 is a sectional view of a magnetoresistive sensor according to a seventh embodiment of the present invention.

FIG. 7 is a partial sectional view, as viewed from the side of a sensor surface positioned to face a recording medium, of a magnetoresistive sensor according to a seventh embodiment of the present invention. In FIG. 7, layers denoted by the same reference numerals as those in FIG. 4 represent the same layers as those in FIG. 4.

In the embodiment shown in FIG. 7, a buffer layer 60 made of a nonmagnetic material is formed on a lower shielding layer 20 serving also as a lower electrode. The buffer layer 60 serves also as a lower gap layer. The buffer layer 60 is preferably made of at least one or more selected from among Ta, Hf, Nb, Zr, Ti, Mo and W. The buffer layer 60 is formed in a film thickness of not more than about 50 Å, for example.

Then, a seed layer 61 is formed on the buffer layer 60. Formation of the seed layer 61 is effective not only in increasing crystal particle sizes in a direction parallel to film surfaces formed on and above the seed layer 61, but also in more satisfactorily achieving an improvement in reliability of electrical conduction, which is represented by an improvement in resistance against electro-migration, and an increase of the resistance change rate (ΔR/R).

The seed layer 61 is formed of, e.g., a NiFe alloy, a NiFeCr alloy or Cr.

An antiferromagnetic layer 30 is formed on the seed layer 61, and a support ferromagnetic layer 28 is formed on the antiferromagnetic layer 30. In the embodiment shown in FIG. 7, the support ferromagnetic layer 28 is of a two-layered structure. A layer formed on the side contacting the antiferromagnetic layer 30 is referred to as a first support ferromagnetic layer 62, and a layer formed on the side contacting the nonmagnetic layer 27 is referred to as a second support ferromagnetic layer 63. By way of example, the first support ferromagnetic layer 62 has a film thickness of 8 Å, and the second support ferromagnetic layer 63 has a film thickness of 6 Å.

In the embodiment shown in FIG. 7, the first support ferromagnetic layer 62 is formed of a ferromagnetic material containing Co (cobalt), such as Co or CoFe. By forming the first support ferromagnetic layer 62 of a ferromagnetic material containing Co (cobalt), an exchange coupling magnetic field generated between the antiferromagnetic layer 30 and the support ferromagnetic layer 28 can be increased. CoFe or CoFeCr is preferably selected as the ferromagnetic material containing Co.

The second support ferromagnetic layer 63 is formed as a layer of NiFe (Permalloy) or NiFeW (where W represents one or more elements selected from among Al, Si, Ti, V, Cr, Mn, Cu, Zr, Nb, Mo, Ru, Rh, Hf, Ta, W, Ir and Pt).

As shown in FIG. 7, on the support ferromagnetic layer 28, a free magnetic layer 26 is formed with a nonmagnetic layer 27 interposed therebetween. In this embodiment, the free magnetic layer 26 is of a two-layered structure.

Of the two-layered structure, a layer on the side contacting the nonmagnetic layer 27 is referred to as a first free magnetic layer 64, and a layer on the side contacting a nonmagnetic material layer 25 is referred to as a second free magnetic layer 65.

In this embodiment, the first free magnetic layer 64 is a layer of NiFe (Permalloy) or NiFeX (where X represents one or more elements selected from among Al, Si, Ti, V, Cr, Mn, Cu, Zr, Nb, Mo, Ru, Rh, Hf, Ta, W, Ir and Pt). The second free magnetic layer 65 is a layer made of a ferromagnetic material containing Co (cobalt), such as Co, CoFe or CoFeNi. In this embodiment, the first free magnetic layer 64 has a film thickness of 100 Å, and the second free magnetic layer 65 has a film thickness of 20 Å. CoFe or CoFeCr is preferably selected as the ferromagnetic material containing Co.

By forming the second free magnetic layer 65 of the free magnetic layer 26 using the ferromagnetic material containing Co (cobalt), it is possible to prevent the material (such as Ni) of the free magnetic layer 26 from diffusing into the nonmagnetic material layer 25, and to avoid a reduction of the magnetic resistance change rate.

In the embodiment shown in FIG. 7, the nonmagnetic material layer 25 and the pinned magnetic layer 24, which made of a hard magnetic material, are successively formed on the free magnetic layer 26, and a barrier layer 66 is formed on the pinned magnetic layer 24. The barrier layer 66 is preferably made of at least one or more selected from among Ta, Hf, Nb, Zr, Ti, Mo and W. The barrier layer 66 is formed in a film thickness of not more than about 50 Å, for example. The barrier layer 66 serves also as an upper gap layer.

A multilayered structure from the buffer layer 60 to the barrier layer 66 is referred to as a multilayered film 67. The multilayered film 67 has opposite end surfaces 67a spaced in the direction of the track width, which are formed as continuous surfaces by etching opposite end portions of the multilayered film 67 from a top surface downward. Insulating layers 32 made of, e.g., $Al_2O_3$ are formed on both sides of the multilayered film 67 to cover the opposite end surfaces 67a thereof. An upper shielding layer 33 serving also as an upper electrode is formed to cover the top surface of the multilayered film 67 and upper surfaces of the insulating layers 32.

The embodiment shown in FIG. 7 is an improved version of the embodiment shown in FIG. 4, i.e., the embodiment in which the pinned magnetic layer 24 is positioned above the free magnetic layer 26 and the pinned magnetic layer 24 is formed of a single hard magnetic material layer alone.

The embodiment shown in FIG. 7 differs from that shown in FIG. 4 in that the buffer layer 60, the seed layer 61 and the barrier layer 66 are present, and the free magnetic layer 26 and the support ferromagnetic layer 28 are each formed of plural layers. The embodiment shown in FIG. 7 can provide a magnetoresistive sensor, which is able to produce a larger resistance change rate (ΔR), a higher reproduction output, and better reproduction characteristics than those obtained in the embodiment shown in FIG. 4.

The above-mentioned structures shown in FIG. 7, i.e., the structures in which the buffer layer 60, the seed layer 61 and the barrier layer 66 are provided and the free magnetic layer 26 and the support ferromagnetic layer 28 are each formed of plural layers, are also applicable to the embodiment shown in FIGS. 1 to 3, 5 and 6.

In each of the foregoing embodiments, the interface between the hard magnetic layer and the nonmagnetic layer or between the hard magnetic layer and the ferromagnetic layer, which constitute the pinned magnetic layer, is often not clearly discernable. This is because the element is diffused under the effect of the heat treatment, etc. Accordingly, when a hard magnetic region formed of a hard magnetic material is present in the pinned magnetic layer in each of the embodiments, such a case is also involved within the scope of the present invention. Therefore, it is not essential that the interface between the hard magnetic layer and anther adjacent layer is clearly discernable.

A description is now made primarily of a method of manufacturing the magnetoresistive sensor of each embodiment, particularly a manner of controlling magnetizations of the free magnetic layer 26 and the pinned magnetic layer 24.

With the method of manufacturing the magnetoresistive sensor shown in FIG. 1, in a first step, the first hard magnetic layer 21, the nonmagnetic layer 22, the second hard magnetic layer 23, the nonmagnetic material layer 25, the free magnetic layer 26, the nonmagnetic layer 27, the support ferromagnetic layer 28, and the antiferromagnetic layer 30 are successively formed on the lower shielding layer 20.

In this step, the product of the coercive force Hc and the film thickness t must be set different between the first hard magnetic layer 21 and the second hard magnetic layer 23. For example, when the first hard magnetic layer 21 and the second hard magnetic layer 23 are both formed of the same hard magnetic material and have the same coercive force Hc, the first hard magnetic layer 21 and the second hard magnetic layer 23 are formed in different film thicknesses.

Then, heat treatment under a magnetic field is performed to generate an exchange coupling magnetic field between the antiferromagnetic layer 30 and the support ferromagnetic layer 28. At this time, the magnetic field is applied in the direction of the track width (X-direction as shown). With the heat treatment under the magnetic field, the support ferromagnetic layer 28 is fixedly magnetized in the direction of the track width. On the other hand, exchange coupling based on the RKKY interaction occurs between the support ferromagnetic layer 28 and the free magnetic layer 26, whereby the free magnetic layer 26 is magnetized in the same direction as or a direction opposed to the direction of magnetization of the support ferromagnetic layer 28 depending on the film thickness of the nonmagnetic layer 27. Because the film thickness of the free magnetic layer 26 is formed much larger than that of the support ferromagnetic layer 28, the magnetization of the free magnetic layer 26 is not pinned and is weakly put into a single domain state to such an extent that the magnetization varies with an external magnetic field.

Subsequently, a magnetic field is applied in the height direction (Y-direction as shown) without heat treatment. Because the heat treatment is not performed, the exchange coupling magnetic field already generated in the direction of the track width remains oriented in the direction of the track width. Although it is estimated that the directions of magnetizations of the support ferromagnetic layer 28 and the free magnetic layer 26 are temporarily disturbed under the effect of the applied magnetic field, the magnetizations of the support ferromagnetic layer 28 and the free magnetic layer 26 are oriented again to a direction parallel to the direction of the track width and are brought into a state antiparallel to each other with the action of exchange coupling based on the exchange coupling magnetic field and the RKKY interaction, described above, upon release of the applied magnetic field.

By applying the magnetic field without heat treatment, the first hard magnetic layer 21 and the second hard magnetic layer 23 each having a strong coercive force Hc are affected. On this occasion, when a magnetic field stronger than the coercive force Hc of the pinned magnetic layer 24 is applied, the second hard magnetic layer 23 having the larger product of the coercive force Hc and the film thickness t is magnetized and pinned in the same direction as that of the applied magnetic field. On the other hand, the first hard magnetic layer 21 is also affected by the applied magnetic field and its magnetization is going to orient in the same direction as that of the applied magnetic field. However, if the exchange coupling generated between the first hard magnetic layer 21 and the second hard magnetic layer 23 based on the RKKY interaction is greater than the coercive force Hc of the second hard magnetic layer 23, the magnetization of the second hard magnetic layer 23 is oriented in a direction opposed to the direction of the applied magnetic field, and pinned in that direction with the actions of its own coercive force Hc and the exchange coupling based on the RKKY interaction described above.

In order to make the exchange coupling generated between the first hard magnetic layer 21 and the second hard magnetic layer 23 based on the RKKY interaction greater than the coercive forces of the first hard magnetic layer 21 and the second hard magnetic layer 23, the film thickness of the nonmagnetic layer 22 requires to be properly adjusted. For example, when the nonmagnetic layer 22 is made of Ru and formed in a film thickness of about 9 Å, the exchange coupling based on the RKKY interaction is generated at a level of about $1.58 \times 10^5$ (A/m). Then, a hard magnetic material having a coercive force Hc smaller than that exchange coupling is selected for use in each of the first hard magnetic layer 21 and the second hard magnetic layer 23.

According to the above-mentioned method, when applying the magnetic field to fixedly magnetize the pinned magnetic layer 24, the magnitude of the applied magnetic field may be greater than that of the exchange coupling magnetic field between the antiferromagnetic layer 30 and the support ferromagnetic layer 28. When the heat treatment under the magnetic field is performed beforehand at the time of controlling the magnetization of the free magnetic layer 26, the magnitude of the magnetic field applied to the pinned magnetic layer 24 is preferably greater than the magnitude of the magnetic field applied for the heat treatment under the magnetic field. The reason resides in that the magnetic field applied for the heat treatment under the magnetic field causes the magnetizations of the first hard magnetic layer 21 and the second hard magnetic layer 23 to temporarily orient in the direction of that magnetic field. By applying a stronger magnetic field, the magnetizations of the first hard magnetic layer 21 and the second hard magnetic layer 23 can be properly pinned in a direction parallel to the height direction. Alternatively, in the case of applying the magnetic field to fixedly magnetize the pinned magnetic layer 24 and then performing the heat treatment under the magnetic field to generate the exchange coupling magnetic field between the antiferromagnetic layer 30 and the support ferromagnetic layer 28, there are no restrictions on the magnitude of the previously applied magnetic field, but the magnitude of the magnetic field applied for the heat treatment subsequently performed under the magnetic field must be smaller than the coercive force Hc of the pinned magnetic layer 24.

Although it is estimated, as described above, that the directions of magnetizations of the support ferromagnetic layer 28 and the free magnetic layer 26 are temporarily disturbed under the effect of the magnetic field applied to the pinned magnetic layer 24, the magnetizations of the support ferromagnetic layer 28 and the free magnetic layer 26 are oriented again to a direction parallel to the direction of the track width upon release of the applied magnetic field.

Thus, since delicate restrictions, which have been required in the related art, are no longer imposed on the magnitude of the magnetic field applied to fixedly magnetize the pinned magnetic layer 24, the magnetizations of the free magnetic layer 26 and the pinned magnetic layer 24 can be easily and reliably brought into an orthogonal state.

The process of achieving the orthogonal state of magnetizations in each of the embodiments of FIGS. 2 to 4 and 7 is the same as that the above-described one performed in the embodiment of FIG. 1, and hence a description thereof is omitted here. However, particularly in the method of manufacturing the magnetoresistive sensors of FIGS. 2 and 4 in which the pinned magnetic layer 24 is formed on the upper side of the free magnetic layer 26, it is possible to eliminate the restriction that the magnitude of the magnetic field applied to fixedly magnetize the pinned magnetic layer 24 must be greater than the magnitude of the magnetic field applied in the heat treatment under the magnetic field performed to control the magnetization of the free magnetic layer 26. The reason resides in that the magnetoresistive sensor can be manufactured, for example, through the steps of forming the film structure until the free magnetic layer 26, then performing the heat treatment under the magnetic field to control the magnetization of the free magnetic layer 26, then forming the pinned magnetic layer 24, and then applying the magnetic field to fixedly magnetize the pinned magnetic layer 24. In other words, the reason resides in that the heat treatment under the magnetic field to control the magnetization of the free magnetic layer 26 can be performed before forming the pinned magnetic layer 24.

The magnetoresistive sensor shown in FIG. 5 can be manufactured using various methods. According to one method, for example, after successively forming, on the lower shielding layer 20, the antiferromagnetic layer 30, the support ferromagnetic layer 28, the nonmagnetic layer 27, the free magnetic layer 26, the nonmagnetic material layer 25, and the third ferromagnetic layer 41, the heat treatment under the magnetic field is first performed while applying the magnetic field in the direction of the track width to generate the exchange coupling magnetic field between the antiferromagnetic layer 30 and the support ferromagnetic layer 28. The support ferromagnetic layer 28 and the free magnetic layer 26 are thereby magnetized in a direction parallel to the direction of the track width and brought into a state antiparallel to each other. Then, the hard magnetic layer 42, the second ferromagnetic layer 43, the nonmagnetic layer 22, and the first ferromagnetic layer 45 are successively formed on the third ferromagnetic layer 41. Alternatively, after forming the hard magnetic layer 42, a magnetic field may be applied to the hard magnetic layer 42 in the height direction so that the hard magnetic layer 42 is magnetized in the height direction beforehand. Subsequently, the heat treatment under the magnetic field is performed in the height direction. If the magnitude of the magnetic field applied in the second heat treatment under the magnetic field is greater than the exchange coupling magnetic field generated between the antiferromagnetic layer 30 and the support ferromagnetic layer 28, the magnetizations of the support ferromagnetic layer 28 and the free magnetic layer 26, which are already oriented in the track width direction, are caused to noticeably fluctuate. Accordingly, there arises a restriction that the magnitude of the magnetic field applied in the second heat treatment must be set smaller than the exchange coupling magnetic field between the support ferromagnetic layer 28 and the antiferromagnetic layer 30. Such a restriction also occurs in the related art shown in FIG. 14. In the related art, however, the magnitude of the applied magnetic field is more severely restricted than the embodiment shown in FIG. 5; namely, the range of the magnitude of the applicable magnetic field is further limited in comparison with the embodiment shown in FIG. 5. In the related art shown in FIG. 14, for example, if the magnitude of the magnetic field applied to generate the exchange coupling magnetic field between the free magnetic layer 2 and the second antiferromagnetic layer 11 is too small, this would be not preferable in that the exchange coupling magnetic field becomes too weak. Conversely, if the magnitude of the applied magnetic field is too great, this would be not preferable in that the exchange coupling magnetic field generated between the antiferromagnetic layer 5 and the pinned magnetic layer 4 is affected, thus causing the magnetization of the pinned magnetic layer 4, which should be held pinned in the height direction, to fluctuate.

By contrast, in the embodiment of FIG. 5, since the pinned magnetic layer 47 includes the hard magnetic layer 42, the range of the magnitude of the magnetic field applicable for the heat treatment under the magnetic field in the height direction can be enlarged. For example, even when the magnitude of the magnetic field applied in that heat treatment is set much smaller than that in the related art to generate the exchange coupling magnetic field between the first antiferromagnetic layer 46 and the first ferromagnetic layer 45, which is smaller than that in the related art, the hard magnetic layer 42 having a strong coercive force Hc is magnetized and its magnetization is pinned in the height direction. Therefore, the magnetization of the first ferromagnetic layer 45 is oriented in a direction opposed to the height direction by the exchange coupling generated between the second ferromagnetic layer 43 and the first ferromagnetic layer 45 based on the RKKY interaction. In particular, by magnetizing the hard magnetic layer 42 in the height direction beforehand, the magnetic field applied for the heat treatment under the magnetic field in the height direction can be set to zero.

Thus, by providing the hard magnetic layer 42 in the pinned magnetic layer 47 like the embodiment shown in FIG. 5, the magnetizations of the free magnetic layer 26 and the pinned magnetic layer 47 can be more easily and reliably brought into an orthogonal state than in the related art.

A method of manufacturing the magnetoresistive sensor shown in FIG. 6 is as follows. After successively forming, on the lower shielding layer 20, the free magnetic layer 26, the nonmagnetic material layer 25, the third ferromagnetic layer 41, the hard magnetic layer 42, the second ferromagnetic layer 43, the nonmagnetic layer 22, the first ferromagnetic layer 45, and the first antiferromagnetic layer 46, the heat treatment under the magnetic field is first performed while applying the magnetic field in the height direction to generate the exchange coupling magnetic field between the first antiferromagnetic layer 46 and the first ferromagnetic layer 45. Also, with the exchange coupling generated between the first ferromagnetic layer 45 and the second ferromagnetic layer 43 based on the RKKY interaction, the magnetization of the first ferromagnetic layer 45 and the magnetizations of the second ferromagnetic layer 43, the hard magnetic layer 42, and the third ferromagnetic layer 41 are brought into an antiparallel state and pinned in a direction parallel to the height direction.

Then, after forming the hard bias layers 50 on both sides of the free magnetic layer 26 in the direction of the track width, the hard bias layers 50 are magnetized in the direction of the track width to put the magnetization of the free magnetic layer 26 in order in the direction of the track width.

In the embodiment shown in FIG. 6, by setting the exchange coupling generated between the first ferromagnetic layer 45 and the second ferromagnetic layer 43 based on the RKKY interaction to be greater than the coercive force Hc of the hard magnetic layer 42, the magnetization of the first ferromagnetic layer 45 and the magnetizations of the second ferromagnetic layer 43, the hard magnetic layer 42, and the third ferromagnetic layer 41 can be brought into an antiparallel state and properly pinned in the direction parallel to the height direction. To this end, the film thickness of the nonmagnetic layer 22 present between the first ferromagnetic layer 45 and the second ferromagnetic layer 43 requires to be properly adjusted for proper adjustment of the magnitude of the above-mentioned exchange coupling based on the RKKY interaction. For example, when the nonmagnetic layer 22 is made of Ru and formed in a film thickness of about 9 Å, the exchange coupling based on the RKKY interaction is generated at a level of about $1.58 \times 10^5$ (A/m). Then, a hard magnetic material having a coercive force Hc smaller than that exchange coupling is selected for use in the hard magnetic layer 42.

In the embodiment shown in FIG. 6, since there are no restrictions imposed on the magnitude of the magnetic field applied to magnetize the hard bias layers 50, the magnetizations of the free magnetic layer 26 and the pinned magnetic layer 47 can be easily and reliably brought into an orthogonal state.

The magnetoresistive sensor according to the present invention can be used in not only a thin-film magnetic head mounted in a hard disk drive, but also in a magnetic head for tapes and a magnetic sensor.

While the preferred embodiments of the present invention have been described above, various modifications can be made without departing from the scope of the present invention.

It is to be noted that the foregoing embodiments have been described merely by way of example, and should not be construed as limiting the scope of claims of the present invention.

The magnetoresistive sensors shown in FIGS. 1 to 7 are all of CPP type, and applying the embodiments of the present invention to CIP type sensors is of no value. The reason resides in that, in the case of CIP type sensors, when the pinned magnetic layer 24 is formed in a larger film thickness, a shunting loss of the sensing current is increased and a reduction of the reproduction output is rather necessarily resulted.

EXAMPLES

In Examples explained below, a Pt amount (at %) of a CoPt alloy used as a hard magnetic material was changed to examine relationships of the Pt amount versus a specific resistance value ρ, a saturation magnetization Ms and a coercive force Hc.

Figure 9:
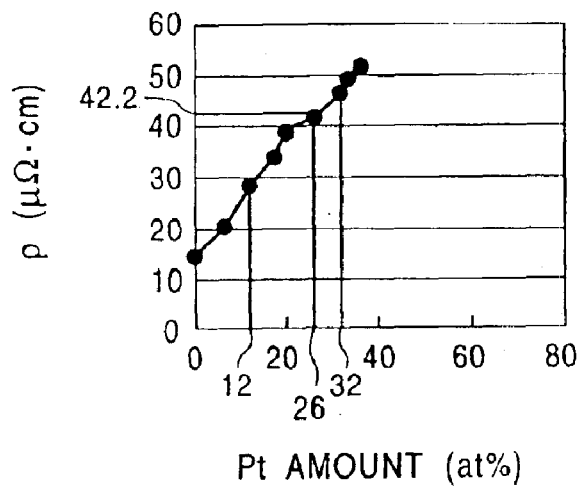
FIG. 9 is a graph showing the relationship between a Pt amount and a specific resistance value p of a CoPt alloy.

FIG. 9 is a graph showing the relationship between the Pt amount and the specific resistance value ρ. As seen from FIG. 9, as the Pt amount increases, the specific resistance value ρ also gradually increases.

Figure 10:
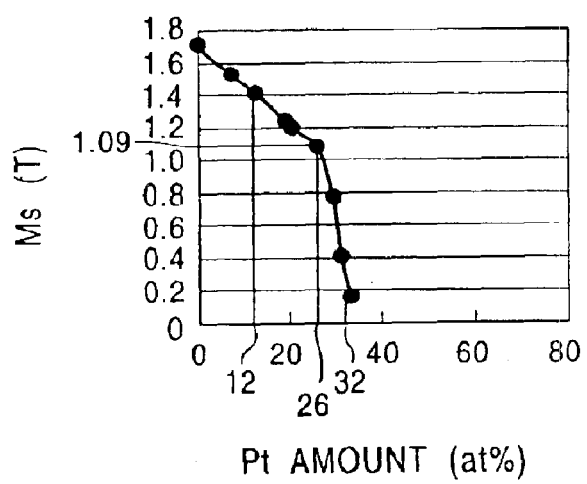
FIG. 10 is a graph showing the relationship between a Pt amount and a saturation magnetization Ms of the CoPt alloy.

FIG. 10 is a graph showing the relationship between the Pt amount and the saturation magnetization Ms. As seen from FIG. 10, as the Pt amount increases, the saturation magnetization Ms gradually decreases.

Figure 11:
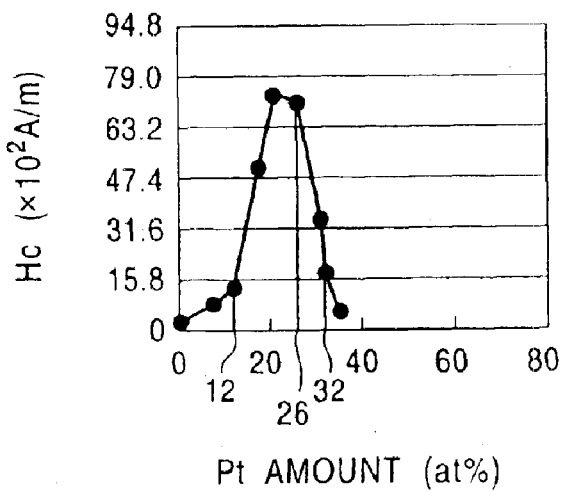
FIG. 11 is a graph showing the relationship between a Pt amount and a coercive force Hc of the CoPt alloy.

FIG. 11 is a graph showing the relationship between the Pt amount and the coercive force Hc. As seen from FIG. 11, as the Pt amount increases to about 20 at %, the coercive force Hc also gradually increases, but as the Pt amount further increases beyond about 20 at %, the coercive force Hc gradually decreases.

From the results shown in those three graphs, in the present invention, the Pt amount was set not less than 12 at %, but not more than 34 at %. The Pt amount set within that range enabled the CoPt alloy to have the specific resistance value ρ of not smaller than 30 ($\mu\Omega$·cm), the saturation magnetization Ms of not more than 1.4 T, and the coercive force Hc of not less than $15.8 \times 10^3$ (A/m) [=200 Oe].

In the present invention, by using the CoPt alloy, which contains the Pt amount of not less than 12 at %, but not more than 34 at %, as the hard magnetic layer constituting the pinned magnetic layer, it is possible to increase ΔRA in accordance with the above-mentioned formula (1) and to manufacture a magnetoresistive sensor having a high output.

Table 1 given below represents, in the form of a table, the relationships of the Pt amount versus the coercive force Hc, the specific resistance value ρ and the saturation magnetization Ms for CoPt with the experiment results of the three graphs for different ranges of the Pt amount.

TABLE 1

|  | Pt amount (at %) | Hc (A/m) | ρ (βΩ · cm) | Ms (T) |
|---|---|---|---|---|
| CoPt | 12–34 | $15.8 \times 10^3$ or more | 30–50 | 0.2–1.4 |
|  | 15–30 | $31.6 \times 10^3$ or more | 31–47 | 0.8–1.37 |
|  | 17–29 | $47.4 \times 10^3$ or more | 34–44 | 0.88–1.25 |
|  | 18–26 | $63.2 \times 10^3$ or more | 37–42 | 1–1.2 |

As seen from Table 1, the CoPt alloy having a stronger coercive force Hc, a higher specific resistance value ρ, and a lower saturation magnetization Ms can be more effectively obtained by gradually narrowing the range of Pt amount to 15–30 at %, then to 17–29 at %, and then to 18–26 at %. It was also confirmed that, within the composition range subjected to the experiments, the β value was substantially constant.

In particular, by setting the Pt amount to be not less than 18 at %, but not more than 26 at %, the coercive force Hc can be increased to $63.2 \times 10^3$ (A/m) [=800 Oe] or more and the specific resistance value ρ can be increased to the range of 37 to 42 ($\mu\Omega\cdot$cm). Also, the saturation magnetization Ms can be reduced down to 1.2 T or less.

In each of the composition ratio ranges mentioned above, the Pt amount is more preferably not less than 26 at %. By setting the Pt amount to be not less than 26 at %, the coercive force Hc can take a high value in the range of $15.8 \times 10^3$ [=200 Oe] to $63.2 \times 10^3$ (A/m) [=800 Oe], and the magnetization of the pinned magnetic layer can be pinned with stability. Also, a specific resistance value of not smaller than about 42 ($\mu\Omega\cdot$cm) can be obtained and therefore ΔR can be increased. Furthermore, since the saturation magnetization Ms can be held down to about 1.2 T or less, the film thickness of the pinned magnetic layer can be increased and hence ΔRA can be increased while weakening the effect of demagnetizing fields upon the free magnetic layer.

According to the present invention, as fully described above, the pinned magnetic layer includes a hard magnetic region therein, and the hard magnetic region has a strong coercive force Hc. To develop and pin magnetization of the hard magnetic region in the height direction, it is just required to apply a magnetic field to magnetize the hard magnetic region in the height direction without utilizing the exchange coupling magnetic field generated between the antiferromagnetic layer and the pinned magnetic layer by heat treatment under a magnetic field, which has been required in the related art. Therefore, the magnetizations of the free magnetic layer and the pinned magnetic layer can be more easily and reliably brought into an orthogonal state than in the related art.

Also, according to the present invention, since the magnetization of the pinned magnetic layer can be controlled without utilizing the exchange coupling magnetic field generated between the antiferromagnetic layer and the pinned magnetic layer, the pinned magnetic layer can be formed in a larger film thickness than that in the related art. Hence, ΔRA can be increased.

Further, by using a hard magnetic material, which has not only a strong coercive force Hc, but also a high β value and a high specific resistance value ρ, as a hard magnetic layer constituting the pinned magnetic layer, ΔRA can be further increased.

In the present invention, a CoPt alloy or the like is preferably used as the hard magnetic material.

Thus, since the magnetoresistive sensor of the present invention can increase ΔRA in comparison with the related art, it is possible to manufacture a magnetoresistive sensor having a higher output. In addition, the magnetizations of the free magnetic layer and the pinned magnetic layer can be easily and reliably brought into an orthogonal state.

What is claimed is:

1. A magnetoresistive sensor including a multilayered film comprising a free magnetic layer, a pinned magnetic layer, and a nonmagnetic material layer interposed therebetween, the sensor being supplied with a current flowing in a direction perpendicular to film surfaces of the layers of said multilayered film, wherein a hard magnetic region formed of a hard magnetic material is present in said pinned magnetic layer, said pinned magnetic layer is fixedly magnetized in a direction parallel to a height direction, and magnetization of said free magnetic layer is oriented in a direction parallel to a direction of a track width, the height direction is substantially perpendicular to the track width direction, said pinned magnetic layer contains a nonmagnetic layer sandwiched between a hard magnetic layer and a first ferromagnetic layer, and a first antiferromagnetic layer is formed on one surface of said first ferromagnetic layer opposed to another surface thereof in contact with said nonmagnetic layer, and in said first ferromagnetic layer, a region containing an element Z (where Z represents at least one element selected from among Cr, Ti, V, Zr, Nb, Mo, Hf, Ta and W) is present in a portion located from an interface with said first antiferromagnetic layer toward said nonmagnetic layer, and a region not containing the element Z is present in a part of a region located from an interface with said nonmagnetic layer toward said first antiferromagnetic layer.

2. A magnetoresistive sensor according to claim 1, wherein said hard magnetic region is formed in a film thickness of not less than 30 Å, but not more than 200 Å.

3. A magnetoresistive sensor according to claim 1, wherein said first ferromagnetic layer is formed of primarily a CoFe alloy, said region containing the element Z is formed of a CoFeZ alloy, and said region not containing the element Z is formed of a CoFe alloy.

4. A magnetoresistive sensor according to claim 1, wherein said pinned magnetic layer is formed below said free magnetic layer, and at least a partial region of said pinned magnetic layer is formed to extend beyond a track width in the direction of the track width.

5. A magnetoresistive sensor according to claim 1, wherein said hard magnetic region is formed of one of a CoPt alloy, a CoPtX alloy (where X represents one or more noble metal elements selected from among Ru, Re, Pd, Os, Ir, Pt, Au and Rh), and a CoPtY alloy (where Y represents one or more elements selected from among Sc, Ti, V, Cr, Mn, Fe, Co, Ni and Cu).

6. A magnetoresistive sensor according to claim 5, wherein a Pt amount of the one of the CoPt alloy, the CoPtX alloy and a the CoPtY also is not less than 12 at %, but not more than 34 at %.

7. A magnetoresistive sensor according to claim 6, wherein the Pt amount is not less than 26 at %.

8. A magnetoresistive sensor according to claim 5, wherein a Pt amount is not less than 15 at %, but not more than 30 at %.

9. A magnetoresistive sensor according to claim 5, wherein a Pt amount is not less than 17 at %, but not more than 29 at %.

10. A magnetoresistive sensor according to claim 5, wherein a Pt amount is not less than 18 at %, but no more than 26 at %.

11. A magnetoresistive sensor according to claim 1, wherein a second ferromagnetic layer is interposed between said hard magnetic layer and said nonmagnetic layer.

12. A magnetoresistive sensor according to claim 11, wherein said second ferromagnetic layer is formed of a CoFe alloy.

13. A magnetoresistive sensor according to claim 11, wherein a third ferromagnetic layer is formed on one surface of said hard magnetic layer opposed to another surface thereof in contact with said second ferromagnetic layer.

14. A magnetoresistive sensor according to claim 13, wherein at least one of said second ferromagnetic layer and said third ferromagnetic layer is formed of a CoFe alloy.

15. A magnetoresistive sensor according to claim 1, wherein a support ferromagnetic layer and a second antiferromagnetic layer are successively formed on one surface of said free magnetic layer opposed to another surface thereof in contact with said nonmagnetic material layer, and a direction of magnetization of said support ferromagnetic layer is oriented in a direction crossing a direction of magnetization of said pinned magnetic layer by an exchange coupling magnetic field generated between said second antiferromagnetic layer and said support ferromagnetic layer.

16. A magnetoresistive sensor according to claim 15, further comprising another nonmagnetic material layer disposed between said free magnetic layer and said support ferromagnetic layer, wherein said free magnetic layer is brought into a single domain state by interlayer coupling magnetic field generated between said free magnetic layer and said support ferromagnetic layer by said other nonmagnetic layer, and a direction of magnetization of said free magnetic layer is oriented in the direction crossing the direction of magnetization of said pinned magnetic layer.

17. A magnetoresistive sensor according to claim 1, further comprising a second ferromagnetic layer formed on one surface of said hard magnetic layer opposed to an other surface thereof in contact with said nonmagnetic layer.

18. A magnetoresistive sensor according to claim 17, wherein said second ferromagnetic layer is formed of a CoFe alloy.

* * * * *

UNITED STATES PATENT AND TRADEMARK OFFICE
CERTIFICATE OF CORRECTION

PATENT NO. : 6,893,740 B2
DATED : May 17, 2005
INVENTOR(S) : Masamichi Saito

It is certified that error appears in the above-identified patent and that said Letters Patent is hereby corrected as shown below:

<u>Column 38,</u>
Line 3, before "the CoPtY also is" delete "a".

Signed and Sealed this

Thirteenth Day of June, 2006

JON W. DUDAS
*Director of the United States Patent and Trademark Office*